(12) United States Patent
Pschenitzka et al.

(10) Patent No.: US 10,804,417 B2
(45) Date of Patent: Oct. 13, 2020

(54) DISPLAY DEVICES UTILIZING QUANTUM DOTS AND INKJET PRINTING TECHNIQUES THEREOF

(71) Applicant: Kateeva, Inc., Newark, CA (US)

(72) Inventors: Florian Pschenitzka, San Francisco, CA (US); Jianglong Chen, San Jose, CA (US); Elena Rogojina, San Jose, CA (US); Steven Van Slyke, San Mateo, CA (US); Conor F. Madigan, San Francisco, CA (US)

(73) Assignee: KATEEVA, INC., Newark, CA (US)

( * ) Notice: Subject to any disclaimer, the term of this patent is extended or adjusted under 35 U.S.C. 154(b) by 196 days.

(21) Appl. No.: 15/727,551

(22) Filed: Oct. 6, 2017

(65) Prior Publication Data

US 2018/0102449 A1 Apr. 12, 2018

Related U.S. Application Data

(60) Provisional application No. 62/440,216, filed on Dec. 29, 2016, provisional application No. 62/413,910, (Continued)

(51) Int. Cl.
*H01L 31/0352* (2006.01)
*G02F 1/13357* (2006.01)
(Continued)

(52) U.S. Cl.
CPC ...... *H01L 31/035218* (2013.01); *C09K 11/02* (2013.01); *G02F 1/133504* (2013.01); *G02F 1/133528* (2013.01); *G02F 1/133617* (2013.01); *H01L 27/14621* (2013.01); *H01L 31/02162* (2013.01); *B32B 2457/202* (2013.01);
(Continued)

(58) Field of Classification Search
CPC ....... H01L 31/035218; H01L 31/02162; H01L 27/14621; H01L 51/0005; G02F 1/133617; G02F 1/133528; G02F 1/133504; G02F 2202/36; G02F 2203/055; G02F 2001/133507; C09K 11/02; Y10T 428/10;
(Continued)

(56) References Cited

U.S. PATENT DOCUMENTS

2008/0169753 A1  7/2008  Skipor et al.
2008/0277626 A1  11/2008  Yang et al.
(Continued)

FOREIGN PATENT DOCUMENTS

WO  WO-2015196573 A1 * 12/2015
WO  WO-2016125481 A1 * 8/2016 ........... C09D 201/00

OTHER PUBLICATIONS

International Search Report and Written Opinion dated Dec. 28, 2017, to PCT Application No. PCT/US17/55666.

*Primary Examiner* — Eli D. Strah
(74) *Attorney, Agent, or Firm* — Hauptman Ham, LLP

(57) ABSTRACT

Ink compositions for forming quantum dot-containing films are provided. Also provided are methods for forming the quantum dot-containing films via inkjet printing and photonic devices that incorporate the quantum dot-containing films as light-emitting layers. The ink compositions include the quantum dots, di(meth)acrylate monomers or a combination of di(meth)acrylate and mono(meth)acrylate monomers, and a one or more multifunctional crosslinking agents.

13 Claims, 38 Drawing Sheets

Related U.S. Application Data filed on Oct. 27, 2016, provisional application No. 62/407,449, filed on Oct. 12, 2016.

(51) Int. Cl.

| | |
|---|---|
| *H01L 31/0216* | (2014.01) |
| *C09K 11/02* | (2006.01) |
| *G02F 1/1335* | (2006.01) |
| *H01L 27/146* | (2006.01) |
| *H01L 51/00* | (2006.01) |
| *G09F 13/22* | (2006.01) |

(52) U.S. Cl.
CPC ........... *G02F 2001/133507* (2013.01); *G02F 2202/36* (2013.01); *G02F 2203/055* (2013.01); *G09F 2013/222* (2013.01); *H01L 51/0005* (2013.01); *Y10T 428/10* (2015.01); *Y10T 428/105* (2015.01); *Y10T 428/1036* (2015.01)

(58) Field of Classification Search
CPC ........... Y10T 428/105; Y10T 428/1036; B32B 2457/202; G09F 2013/222
See application file for complete search history.

(56) References Cited

U.S. PATENT DOCUMENTS

| | | | |
|---|---|---|---|
| 2009/0314991 A1 | 12/2009 | Cho et al. | |
| 2010/0086701 A1* | 4/2010 | Iftime | C09D 11/101 427/511 |
| 2011/0233514 A1 | 9/2011 | Lu et al. | |
| 2011/0281388 A1* | 11/2011 | Gough | B82Y 20/00 438/47 |
| 2015/0177230 A1 | 6/2015 | Li | |
| 2015/0243816 A1* | 8/2015 | Nachtigal | B32B 27/06 136/259 |
| 2015/0300600 A1* | 10/2015 | Dubrow | B32B 9/04 362/330 |
| 2015/0301408 A1* | 10/2015 | Li | G02F 1/133621 362/84 |
| 2016/0024322 A1 | 1/2016 | Jain et al. | |
| 2016/0126499 A1* | 5/2016 | Dai | H01L 27/3211 257/40 |
| 2016/0161801 A1 | 6/2016 | Watano et al. | |
| 2016/0164031 A1 | 6/2016 | Pieper et al. | |
| 2017/0062762 A1 | 3/2017 | Jain et al. | |
| 2017/0321114 A1* | 11/2017 | Kamo | C09D 201/00 |

\* cited by examiner

FIG. 1B

| Glass | Anti-Photoluminescence Layer(s) | QD Color Filter | Polarizer (optionally, with ITO coating) | Spacer | Liquid crystal | TFT array on glass | Polarizer + Enhancement film | Diffuser | BLU (Blue LED) |

FIG. 1A

| Glass | Polarizer Layer | Color Filter Layer (optionally, with ITO coating) | Spacer | Liquid crystal | TFT array on glass | Polarizer + Enhancement film | Diffuser | White Light Source |

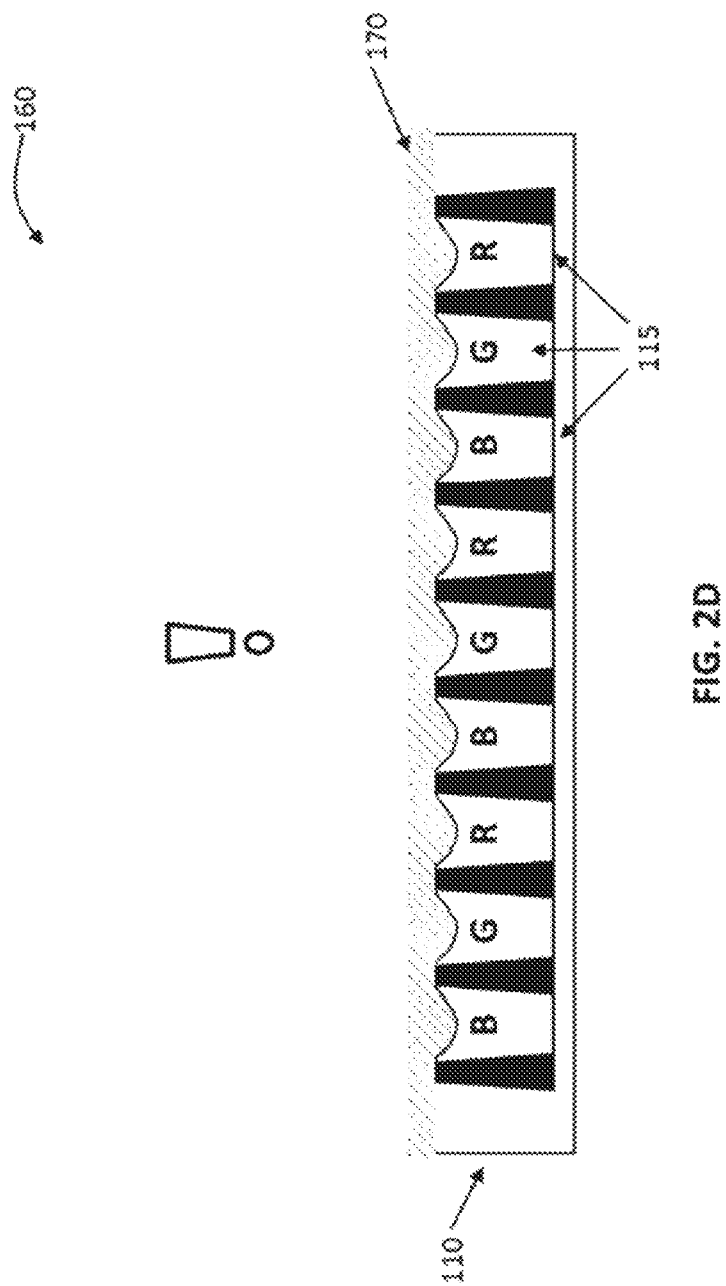

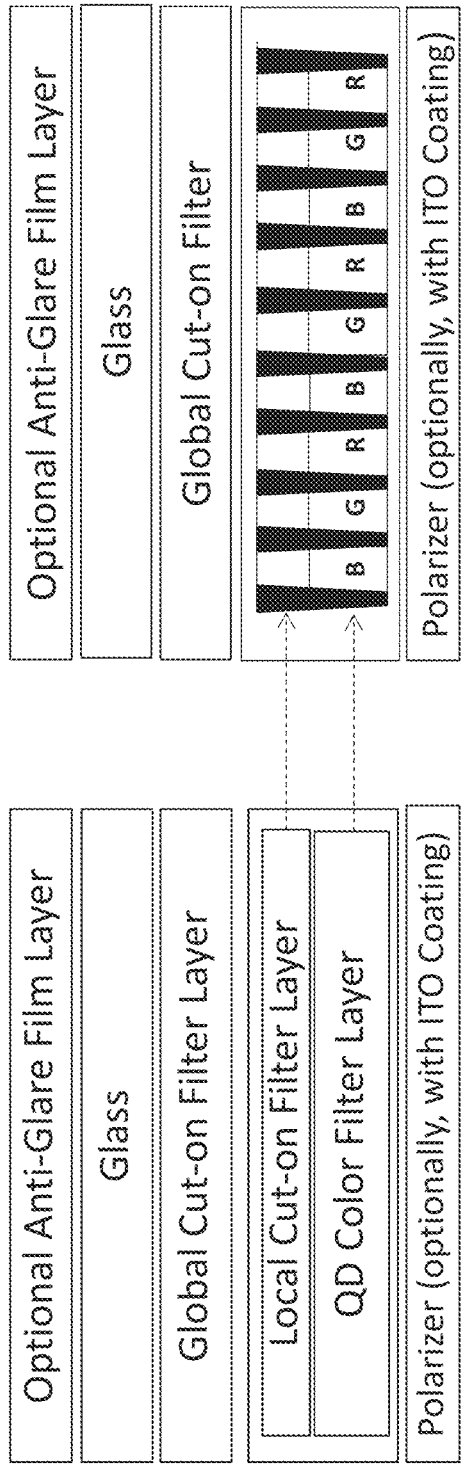

| # | Monomer chemical identity | η, cP | ST, dynes/cm |
|---|---|---|---|
| 1 | Cyclic trimethylolpropane formal acrylate | 17.3 | 38.3 |
| 2 | propoxylated (2) neopentyl glycol diacrylate | 16.5 | 33.7 |
| 3 | Alkoxylated tetrahydrofurfuryl acrylate | 13.8 | 35.9 |
| 4 | 2-phenoxyethyl acrylate | 11.1 | 40.8 |
| 5 | 1,6-hexanediol diacrylate | 7.36 | 36 |
| 6 | 1,3-butylene glycol diacrylate | 6.99 | 33.7 |
| 7 | 2(2-ethoxyethoxy) ethyl acrylate | 3.56 | 32.2 |

FIG. 25

| Monomer chemical identity | | QD ink base composition: |
|---|---|---|
| propoxylated (2) neopentyl glycol diacrylate | | 84.55% monomer; 6.65% PET; 3.8% TPO; 5% 2CEA |
| 1,6-hexanediol diacrylate | | |

FIG. 27

| QD type | QD ink composition: | η, cP | ST, dynes/cm |
|---|---|---|---|
| Red QD | 83.8% 1,6-hexanediol diacrylate:<br>6.58 % PET:<br>3.76 % TPO:<br>4.95 % 2CEA:<br>1 % QDs | 8.87 | 33.5 |
| Green QD | | 5.5 | 28.8 |

FIG. 28

DISPLAY DEVICES UTILIZING QUANTUM DOTS AND INKJET PRINTING TECHNIQUES THEREOF

CROSS-REFERENCE TO RELATED APPLICATIONS

This application claims priority to: U.S. provisional patent application No. 62/407,449, filed on Oct. 12, 2016; U.S. provisional patent application No. 62/413,910, filed on Oct. 27, 2016; and U.S. provisional patent application No. 62/440,216, filed on Dec. 29, 2016, the entire contents of which are incorporated herein by reference.

OVERVIEW

Liquid crystal display (LCD) device technology continuously evolves with respect to improving the end-user experience. One aspect of improving the end user experience has been to target expanding the color gamut of LCD devices.

Accordingly, quantum-dot (QD) technology has been explored with respect to expanding the color gamut of LCD devices. Generally, as will be discussed in more detail subsequently herein, various technology solutions are based on a modification to an LCD device assembly that includes a polymeric sheet or rod in which QDs are embedded.

The present inventors have recognized that inkjet printing techniques can be used to provide innovative QD color enhancement devices (CEDs), as well as being used to provide incorporation of QDs into a subassembly of an LCD device, as well as incorporation in an LCD panel subassembly of an LCD device.

SUMMARY

Ink compositions for forming quantum dot-containing films are provided. Also provided are methods for forming the films via inkjet printing and light-emitting devices that incorporate the films.

One embodiment of a method of forming a light-emitting layer in a photonic device includes: inkjet printing a layer of an ink composition on a device substrate of the photonic device, and curing the ink composition. One embodiment of an ink composition includes: 70 wt. % to 96 wt. % di(meth) acrylate monomers or a combination of di(meth)acrylate monomers and mono(meth)acrylate monomers; 4 wt. % to 10 wt. % multifunctional (meth)acrylate crosslinking agent; and 0.1 wt. % to 5 wt. % quantum dots, wherein the ink composition has a viscosity in the range from 2 cps to 30 cps and a surface tension at 22° C. in the range from 25 dyne/cm to 45 dyne/cm at a temperature in the range from 22° C. to 40° C.

One embodiment of a photonic device includes: a photonic device substrate; and a crosslinked polymer film on the photonic device substrate, the crosslinked polymer film including: 70 wt. % to 96 wt. % polymer chains comprising polymerized di(meth)acrylate monomers, or a combination of polymerized di(meth)acrylate monomers and mono (meth)acrylate monomers; 4 wt. % to 10 wt. % polymerized multifunctional (meth)acrylate monomers crosslinking the polymer chains; and 0.1 wt. % to 5 wt. % quantum dots.

BRIEF DESCRIPTION OF THE DRAWINGS

A better understanding of the features and advantages of the present disclosure will be obtained by reference to the accompanying drawings, which are intended to illustrate, not limit, the present teachings. In the drawings, which are not necessarily drawn to scale, like numerals may describe similar components in different views. Like numerals having different letter suffixes may represent different instances of similar components.

FIG. 1A is a schematic illustration, which represents various layers that may be included in an embodiment of an LCD display device. FIG. 1B is a schematic illustration, which represents various layers that may be included in another embodiment of an LCD display device.

FIG. 2D illustrates the printing of a barrier or planarization layer over embodiments of the QD color filter of FIG. 2C.

FIG. 3F is a schematic illustration of the upper layers of an LCD device similar to that of FIG. 2A, except that the layer stack further includes a global cut-on filter layer. FIG. 3G is a cross-sectional side view of the upper layers of the LCD device according to FIG. 3F, including the blue, green, and red sub-pixels in the QD color filter.

FIG. 25. Table of the structures, room temperature viscosities, and room temperatures surface tensions of cyclic trimethylolpropane formal acrylate, alkoxylated tetrahydrofurfuryl acrylate, 2-phenoxyethyl acrylate, 1,3-butylene glycol diacrylate, and 2(2-ethoxyethoxy)ethyl acrylate.

FIG. 27. Table of the formulations for two base ink compositions, as described in Example 1.

FIG. 28. Table of formulations for two QD-containing ink compositions, along with their room temperature surface tensions and viscosities, as described in Example 1.

DETAILED DESCRIPTION

Figures 2A, 2B:
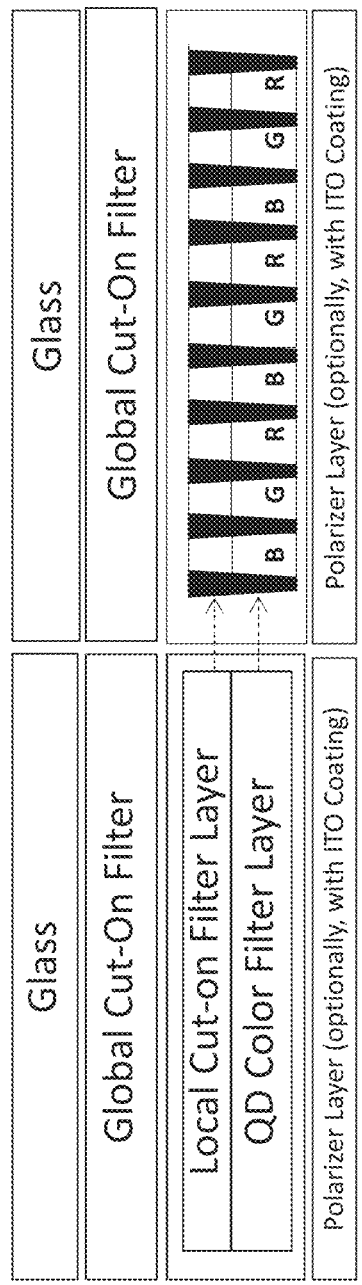
FIG. 2A is a schematic illustration of the upper layers of an LCD device that includes a QD color filter.
FIG. 2B is a cross-sectional view of the upper layers of the LCD device of FIG. 2A, showing the configuration of the QD color filter.

Ink compositions for forming QD-containing films are provided. Also provided are methods for forming the QD-containing films via inkjet printing and photonic devices that incorporate the QD-containing films. The QD-containing films can be incorporated as light-emitting layers in a variety of optoelectronic devices. Although the description that follows illustrates the use of the QD-containing films as color filter layers and color enhancement layers in devices such as LCDs or organic light-emitting diodes (OLEDs), the QD-containing films can be incorporated into other devices that include a QD-containing light-emitting layer.

Display Devices Having Color Filters Incorporating a QD-Containing Layer

FIG. 1A is a schematic illustration that represents various layers that may be included in an LCD display device. For various display devices, for example, for various LCD devices, and for some types of organic light emitting diode (OLED) devices, light is directed from a source of white light located in back of the individual sub-pixels of a color filter array. The sub-pixels can be, but are not limited to, red (R) sub-pixels, green (G) sub-pixels, and/or blue (B) sub-pixels. For LCD devices, the light source may be a backlight source that illuminates many sub-pixels in a color filter array at once, at a common brightness which can be adjusted based on the image to be displayed. The light transmitted through each of the sub-pixels of a color filter array can be further modulated by a corresponding liquid crystal filter associated with each sub-pixel of a color filter array. The liquid crystal filter can be controlled by, for example, a transistor circuit. In the case of OLED devices, the light supplied to each of the sub-pixels of a color filter array typically comes from a white OLED device and the brightness of each sub-pixel is modulated by a transistor circuit. For either various embodiments of LCD devices or OLED devices, each sub-pixel of a color filter array contains a light filtering media that transmits light only within a prescribed electromagnetic wavelength bandwidth associated with the sub-pixel color. Manufacturing a conventional color filter array can be done using, for example, photolithographic techniques, which are complex processes requiring many separate sequences of, for example, blanket coating, photo-exposure, and development to fabricate both the light blocking "black matrix" material in between the sub-pixels, as well as the individual color filter material deposition sequences (e.g. one each for R, G, and B). Though FIG. 1A indicates an indium tin oxide (ITO) layer, which in various embodiments can be coated on the polarizer surface positioned towards the liquid crystal, various embodiments of an LCD display device do not include an ITO coating on a polarizer. The device might have an anti-glare layer to reduce glare caused by ambient light.

FIG. 1B is a schematic illustration that represents various layers that may be included in an LCD display device according to the present teachings. In the device of FIG. 1B, the color filter shown in FIG. 1A has been replaced by a color filter layer fabricated using QDs. The QDs are small crystalline particles that absorb incident radiation having a first wavelength, or a first range of wavelengths, and convert the energy of the radiation into light having a different wavelength, or a different range of wavelengths, which is emitted from the QDs within a very narrow part of the optical spectrum. Thus, by incorporating QDs of appropriates sizes and materials in appropriate concentrations and ratios into a light-emitting device layer, that layer can be designed to alter the absorption and/or emission spectra of a photonic device that incorporates the layer. Thus, the QD-containing color filter layers are so called because they "filter" incoming light having a first wavelength or wavelength range, such as ultraviolet or blue light, by converting at least a portion of it into light having a different wavelength or wavelength range, such as red and/or green light. On a first side of a QD-containing color filter, as depicted in FIG. 1B, there can be a polarizer layer.

An LCD device may also utilize an anti-photoluminescent layer in conjunction with a QD-containing color filter (referred to herein as a QD color filter). Since the color filter sub-pixels that utilize QDs are at the front of the display, it is desirable to avoid having ambient light act as a source of excitation for QDs in the color filter layer. Accordingly, various embodiments of LCD devices utilize various local and global filter layers acting as anti-photoluminescent layers. Similarly, this layer of filters can also be utilized to prevent excess blue light (which has not been absorbed and converted by the QD layer) to be transmitted and thus decrease the color gamut of the display. Moreover, as will be described in more detail herein, inkjet printing can be used to fabricate the QD-containing layers of various embodiments of the QD color filters, as well as various anti-photoluminescent layers for such devices.

FIG. 2A is a schematic illustration of the upper layers of an LCD device of the type shown in FIG. 1B. FIG. 2B is a cross-sectional view of the upper layers of the LCD device. As noted for FIG. 1B, on a first side of a QD-containing layer of the QD color filter there can be a polarizer layer. In various embodiments of a QD-containing color filter as illustrated generally herein, for FIG. 1B, FIG. 2A, FIG. 2B, FIG. 2E, FIG. 3A, FIG. 3B, FIG. 3F, and FIG. 3G, a conductive film, such as an ITO film, can be coated on the polarizer layer, while in other embodiments, the device may not require an ITO coating. In various embodiments of an LCD device for which a conductive coating is utilized, other conductive, transparent materials can also be used, for example, but not limited by, fluorine-doped tin oxide (FTO), doped zinc oxide, and graphene, as well as combinations of such materials can be used. As shown in FIG. 2B, the QD color filter includes a plurality of sub-pixel cells defined by sub-pixel banks (depicted as thick black sections). The sub-pixels formed in the sub-pixel cells include red sub-pixels (designated with an "R" in FIG. 2B), green sub-pixels (designated with a "G" in FIG. 2B), and blue sub-pixels (designated with a "B" in FIG. 2B). Each red sub-pixel includes a red light-emitting layer containing red-emitting QDs dispersed in a polymer matrix. Similarly, each green sub-pixel includes a green light-emitting layer containing green-emitting QDs dispersed in a polymer matrix. In some embodiments of the LCD device in which the BLU is an ultraviolet light, each blue sub-pixel includes a blue light-emitting layer containing blue-emitting QDs in a polymer matrix. In other embodiments of the LCD device in which the BLU is a blue light, the blue sub-pixels in the QD color filter need not include QDs, but can, optionally, include a polymer matrix that at least partially transmits the blue light from the BLU. The polymer matrices in the sub-pixels are capable of transmitting light across at least certain portions of the visible spectrum. By way of illustration, BLU may be composed of one or more blue LEDs.

In the LCD device of FIG. 2B, an anti-photoluminescent layer is provided in the form of a global cut-on filter layer and a local cut-on filter layers. More information about the structure of global and local cut-on filter layers (also referred to as global light filter layers and local light filter layers) is provided in FIGS. 3A, 3B, 3F, and 3G and their accompanying description below.

In addition to the QDs, the light-emitting layers of the sub-pixels can contain scattering nanoparticles (SNPs), which may be geometric scattering nanoparticles (GSNPs), plasmonic scattering nanoparticles (PSNPs), or a combination thereof. It should be noted that, although the PSNPs and GSNPs will generally have at least one nanoscale dimension—that is, at least one dimension of not greater than about 1000 nm, the nanoparticles need not be round particles. For example, the nanoparticles can be elongated particles, such as nanowires, or irregularly shaped particles. Such scattering nanoparticles can also be included in the matrix material of blue sub-pixels that do not contain any QDs. Scattering by GSNPs is accomplished by refraction at the surface of the particle. Examples of GSNPs include metal oxide nanoparticles, such as nanoparticles of zirconium oxide (i.e. zirconia), titanium oxide (i.e. titania) and aluminum oxide (i.e. alumina) A PSNP is characterized in that incident light excites an electron density wave in the nanoparticle that creates a local oscillating electric field extending out from the surface of the nanoparticle. In addition to the scattering effect of the particle, if the PSNP is in close proximity to one or more QDs, this electric field can couple to the QDs, thereby enhancing the absorption of the QD layer. Examples of PSNPs include metal nanoparticles, such as nanoparticles of silver.

Figure 2C:
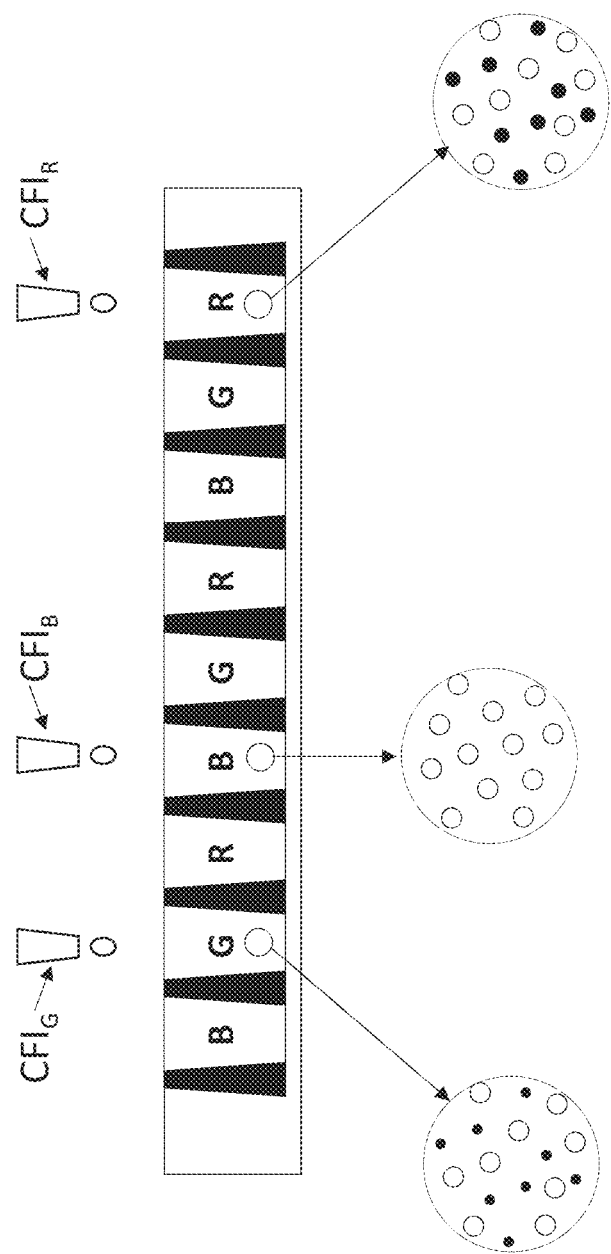
FIG. 2C illustrates the printing of a QD color filter that includes scattering nanoparticles (represented by open circles) in its green sub-pixels, red sub-pixels, and blue sub-pixels.

FIG. 2C shows an example of a QD color filter 160 that includes GSNPs that can be formed using inkjet printing into a plurality of sub-pixel cells 115 formed in substrate 110. As depicted in FIG. 2C, an ink composition containing green QDs ($CFI_G$), an ink composition containing blue QDs ($CFI_B$), and an ink composition containing red QDs ($CFI_B$) can be printed to form to form the green, blue, and red light-emitting layers, respectively, of QD color filter 160. As illustrated generally in FIG. 2C, the various QD inks can include SNPs (represented by open circles)), which can be incorporated in the green sub-pixels, the red sub-pixels, and the blue sub-pixels. (As depicted in FIG. 2C, the green QDs are represented by the smaller solid circles and the red QDs are represented by the larger solid circles.). The SNPs provide enhanced light absorption and extraction by acting as light scattering centers in the polymer matrices. Including SNPs in combination with the QDs can increase the color conversion efficiency of a QD-containing sub-pixel by increasing photon scattering in the interior of the light-emitting layer, so that there are more interactions between the photons and the QDs and, therefore, more light absorption by the QDs.

In embodiments of QD color filters that include blue-emitting QDs in the blue sub-pixels, SNPs (for example, GSNPs) could also be included in those sub-pixels. However, even blue sub-pixels that lack QDs can include SNPs dispersed in a polymer matrix to provide isotropic blue light emission from the blue sub-pixels that is equivalent to, or nearly equivalent to, the isotropic red and green light emission that is provided by the red and green sub-pixels, such that the optical appearance of the emitted blue light (e.g., haze and specular emission) is similar to that of the emitted red and green light. However, in order to avoid unwanted scattering of ambient light in the sub-pixels, some embodiments of the light-emitting layers are free of SNPs.

The QDs and, if present, GSNPs and/or PSNPs can be incorporated into the light-emitting layer of a sub-pixel by including them in an ink composition, depositing them by inkjet printing the ink composition as a layer in a sub-pixel cell, and drying and/or curing the printed ink composition. By way of illustration, an effective scattering nanoparticle size in the range from about 40 nm to about 1 µm, depending on the type of scattering, can be selected for use in a jettable ink. The GSNPs will typically be larger than the PSNPs and both types of particles will generally be larger than the QDs. By way of illustration only, in various embodiments of the ink compositions and the layers formed therefrom, the GSNPs have an effective size in the range from about 100 nm to about 1 µm and the PSNPs have an effective size in the range from about 10 nm to about 200 nm.

FIG. 2D illustrates generally a process for printing a polymeric layer on various embodiments of QD color filter 160. According to the present teachings, polymeric layer 170 can be printed after the formation of the QD-containing light-emitting layer of the QD color filter. According to the present teachings, polymeric layer 170 can be a planarization layer. In various embodiments, polymeric layer 170 can be a planarization layer that may additionally act as a protective layer. For various embodiments of a QD color filter, as will be described in more detail for FIG. 2E, polymeric layer 170 can be printed over an inorganic barrier layer. As will be described in more detail herein, polymeric layer 170 can be formed from a polymer-based ink composition that, when subsequently cured or dried, can form polymeric layer 170. Polymeric layer 170 can be, for example, between about 1 µm (micron) to about 5 µm (micron) in thickness. As illustrated generally in FIG. 2D, there can be surface topology occurring as a result of the sub-pixel cell structures in conjunction with, for example, formation of a meniscus occurring in the sub-pixel cells. As such, inkjet printing can be done to compensate for the variation in surface topology, for example, by printing more of a polymer-based ink composition over areas where there are depressions, and less of a polymer-based ink composition over areas that are raised relative to the areas of depression.

In various embodiments of a polymer-based ink composition of the present teachings that can be used to form polymeric layer 170 of FIG. 2D, particles of various shapes and materials can be added to an ink composition for the purpose of providing refractive index adjustment of a polymeric layer formed over the QD-containing sub-pixels. In various embodiments of such a polymeric-film forming ink composition, metal oxide nanoparticles, such as zirconium oxide, aluminum oxide, titanium oxide, and hafnium oxide of size, for example, between about 5 nm to about 50 nm, can be added to an ink. For various embodiments of such a polymeric-film forming ink composition, graphene nanostructures, such as graphene nanoribbons and graphene platelets, can be added to an ink composition in order to substantially reduce the water vapor permeation through the polymeric layer. According to the present teachings, graphene platelets can have dimensions of, for example, between about 0.1 nm to about 2 nm in thickness and between about 100 nm to about 1 µm (micron) in diameter, while graphene nanoribbons can have dimensions of between, for example, about 0.1 nm to 10 nm in thickness and length of between about 1 nm to about 20 nm. Loading of various graphene nanoparticles in an ink composition of the present teachings can be between about 0.1% and 1.0%.

Figure 2E:
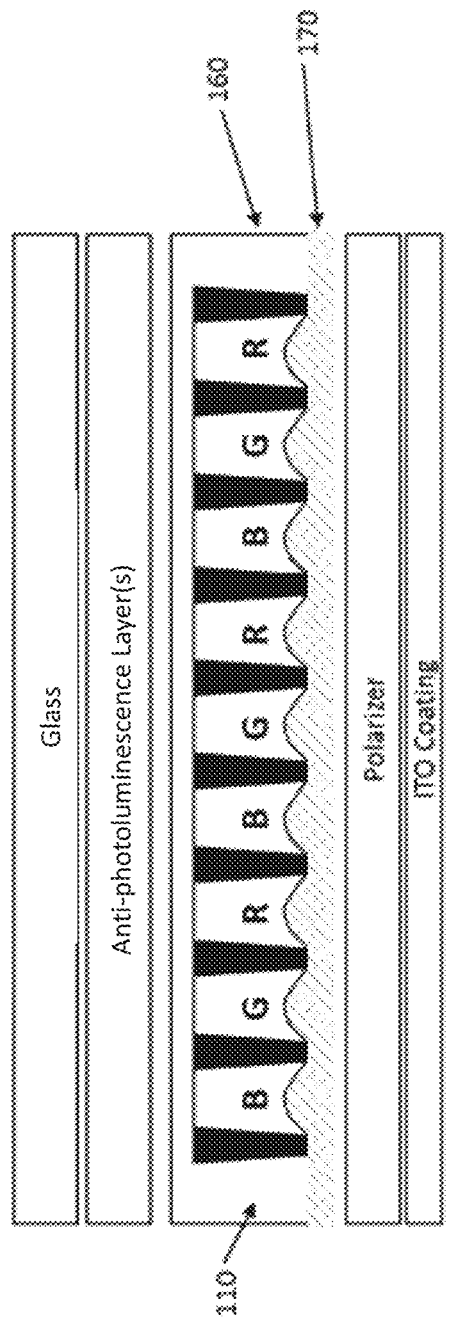
FIG. 2E illustrates an LCD device utilizing the QD color filter of FIG. 2D.

FIG. 2E illustrates generally a portion of an LCD device, for example, as depicted in FIG. 1B, depicting planarizing layer 170 of QD color filter 160 oriented towards a polarizer, for which an ITO layer as previously discussed herein can be optional. In various embodiments of QD color filter 160, planarization layer can be, for example, a polyethylene terephthalate (PET) film, an acrylate-based polymeric film, or the like. QDs embedded in the QD-containing sub-pixels of QD color filter 160 are known to degrade when exposed to atmospheric gases, such as water vapor, oxygen and ozone. Thus, in various embodiments of the QD color filter, polymeric layer 170 can be coupled to an inorganic barrier layer that protects the QD-containing layer from the ingress of water vapor, oxygen, and/or ozone. The inorganic barrier layer, which can be disposed above or below polymeric layer 170, can be comprised of inorganic materials, such as metal oxides, metal nitrides, metal carbides, metal oxynitrides, metal oxyborides, and combinations thereof. For example, the inorganic barrier layer can be composed of a material such as a silicon nitride material ($SiN_x$), aluminum oxide ($Al_2O_3$), titanium oxide ($TiO_2$), hafnium oxide ($HfO_2$), or a silicon oxynitride material ($SiO_xN_y$), or combinations thereof. According to the present teachings, layer 170 can be a combination of a first barrier layer composed of at least one inorganic barrier material as described herein, followed by a second polymeric layer. If present, the polymeric planarization layer and the barrier layer should be capable of transmitting light in the visible region of the electromagnetic spectrum. Polymeric protective layers can be deposited using inkjet printing, as exemplified by U.S. Patent Publication 2016/0024322.

To prevent excitation of the quantum dots by ambient light three embodiments of the CED are proposed: (1) a CED containing only a global cut-on filter; (2) a device containing only local cut-on filters; and (3) a device containing both global and local cut-on filters.

Figure 3B:
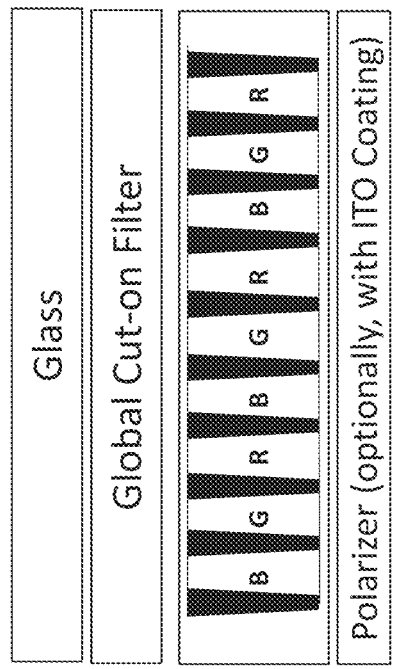
FIG. 3B is a cross-sectional side view of the upper layers of an LCD device according to FIG. 3A, including the blue, green, and red sub-pixels in the QD color filter.
Figure 3A:
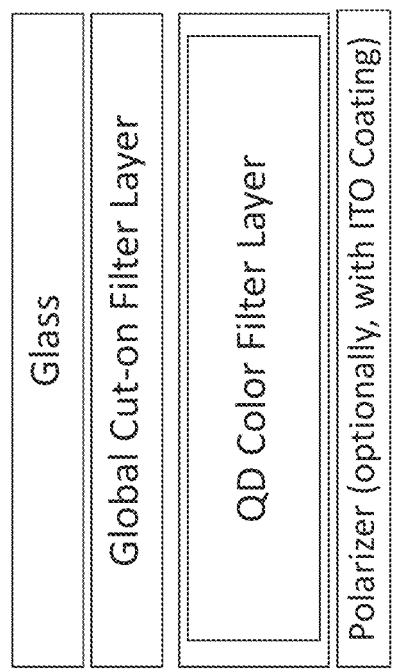
FIG. 3A is a schematic illustration of the upper layers of an LCD device in which the layer stack does not include local cut-on filters in the sub-pixel cells.
Figure 3C:
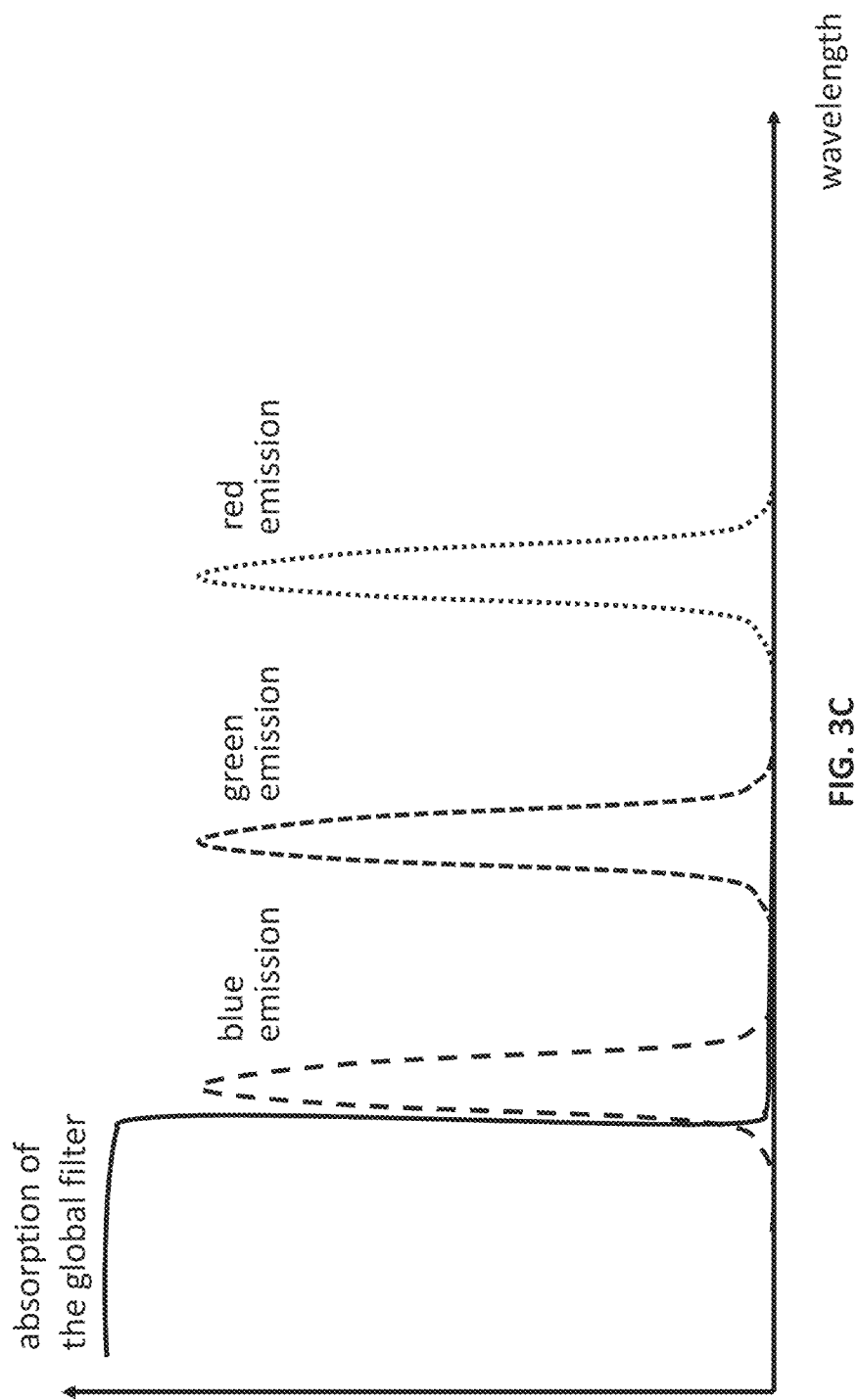
FIG. 3C shows the absorbance spectrum of a global cut-on filter that absorbs radiation having wavelengths shorter than the blue emission wavelengths of the device.

Some embodiments of the LCD devices will include a global cut-on filter layer, without any local cut-on filters. One such device is shown schematically in FIGS. 3A and 3B. FIG. 3A is a schematic illustration of the upper layers of an LCD device. FIG. 3B is a cross-sectional side view of the upper layers, including the blue, green, and red sub-pixels in the QD color filter layer. The global cut-on filter can be deposited on either side of the glass substrate. Ambient light with shorter wavelengths than the blue emission will be blocked from entering the QD layer and, therefore, will not excite the red and green QDs. This global cut-on filter layer may be continuous and unpatterned, and may be disposed on either side of the substrate of the QD color filter. The global cut-on filter layer is desirably of high optical performance with a steep cut-on filter characteristic.

Figure 3D:
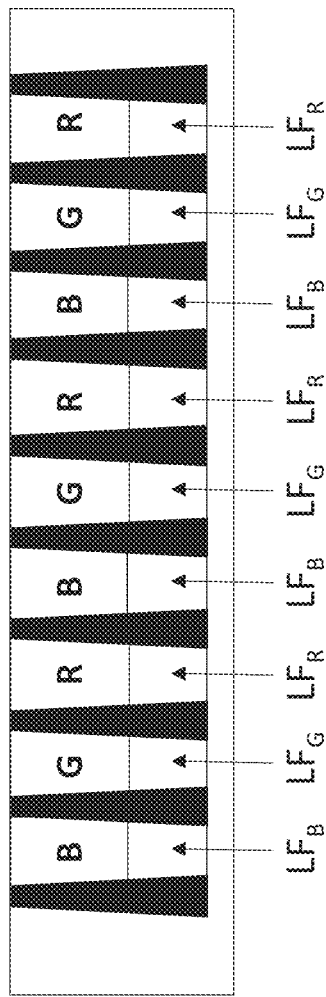
FIG. 3D shows a cross-sectional side view of an embodiment of a QD color filter that includes local light filter layers adjacent to QD-containing layers in the sub-pixels.
Figure 3E:
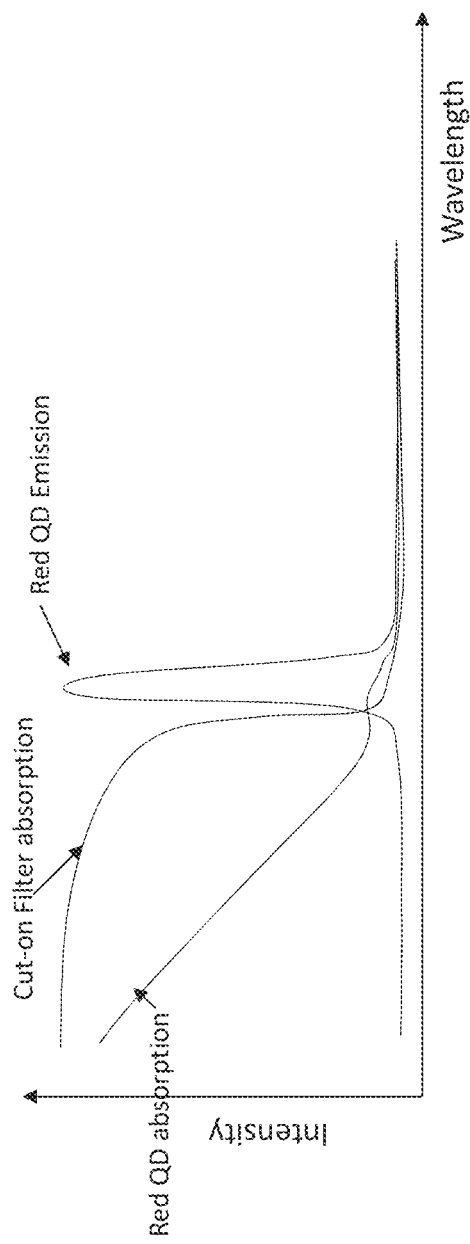
FIG. 3E shows the absorbance spectrum of a red sub-pixel-specific cut-on filter layer; the absorbance spectrum of the red-emitting QDs in a light-emitting layer; and the emission spectrum of the red-emitting QDs in the light-emitting layer for a red sub-pixel.

FIG. 3D shows a cross-sectional side view of an embodiment of a QD color filter that includes a local light filter layer disposed between the substrate and the light-emitting surface of the QD-containing layer in each sub-pixel cell. These local light filter layers serve to filter out ambient light incident on the device that would otherwise enter the QD-containing layers and be absorbed by the QDs, creating unwanted photoluminescence and degrading the optical quality of the LCD. By the same mechanism, these local light filters can also filter out any excess blue light from the BLU which has not been absorbed by the QD layer and which would otherwise cause a diminished color saturation and diminished color gamut for the display. As illustrated in FIG. 3E, the local light filter layers (LFs) act as a sub-pixel-specific cut-on filter; absorbing radiation at wavelengths below the emission wavelengths of the QDs in the QD-containing light-emitting layer and transmitting radiation at wavelengths at and above the emission wavelengths of the QD-containing light-emitting layer. In FIG. 3E, the local light filter layer is illustrated for a red sub-pixel. The local light filter layers include light absorbers with the appropriate light absorbing properties. Thus, a local light filter layer for a red sub-pixel ($LF_R$) will include a light absorber that absorbs radiation at wavelengths below the red light emission wavelengths of the red-emitting QDs in the red-emitting sub-pixel and transmits radiation at wavelengths at and above the red light emission wavelengths of the red-emitting QDs in the red-emitting sub-pixel. Similarly, a local light filter layer for a green sub-pixel ($LF_G$) will include a light absorber that absorbs radiation at wavelengths below the green light emission wavelengths of the green-emitting sub-pixel and transmits radiation at wavelengths at and above the green light emission wavelengths of the green-emitting sub-pixel. And, if blue QDs are being used, a local light filter layer for a blue sub-pixel ($LF_B$) will include a light absorber that absorbs radiation at wavelengths below the blue light emission wavelengths of the blue-emitting sub-pixel and transmits radiation at wavelengths at and above the blue light emission wavelengths of the blue-emitting sub-pixel. Local light filter layers could be omitted if the blue sub-pixels are free of QDs, in which case the sub-pixel cells corresponding to the blue sub-pixels could be completely filled with a matrix material that is optically transparent to blue light. The local filters can be deposited using, for example, inkjet printing; the light absorbing materials would be deposited into the sub-pixel cell and dried/cured before the QD-containing light-emitting layer of the QD color filter was deposited in the sub-pixel cell. In this way, two discrete layers could be formed within a sub-pixel cell, with the local cut-on filter layer facing the outside of the device after assembly and, thus, protecting the QD color filter layer from unwanted excitation.

In a variation of the LCD shown in FIG. 2B, the local light filter layers can be formed underneath their respective sub-pixel cells, rather than within those sub-pixel cells. In this variation, the local light filter layers could be formed in a pattern over the sub-pixel cells using, for example, photolithography.

Figure 3H:
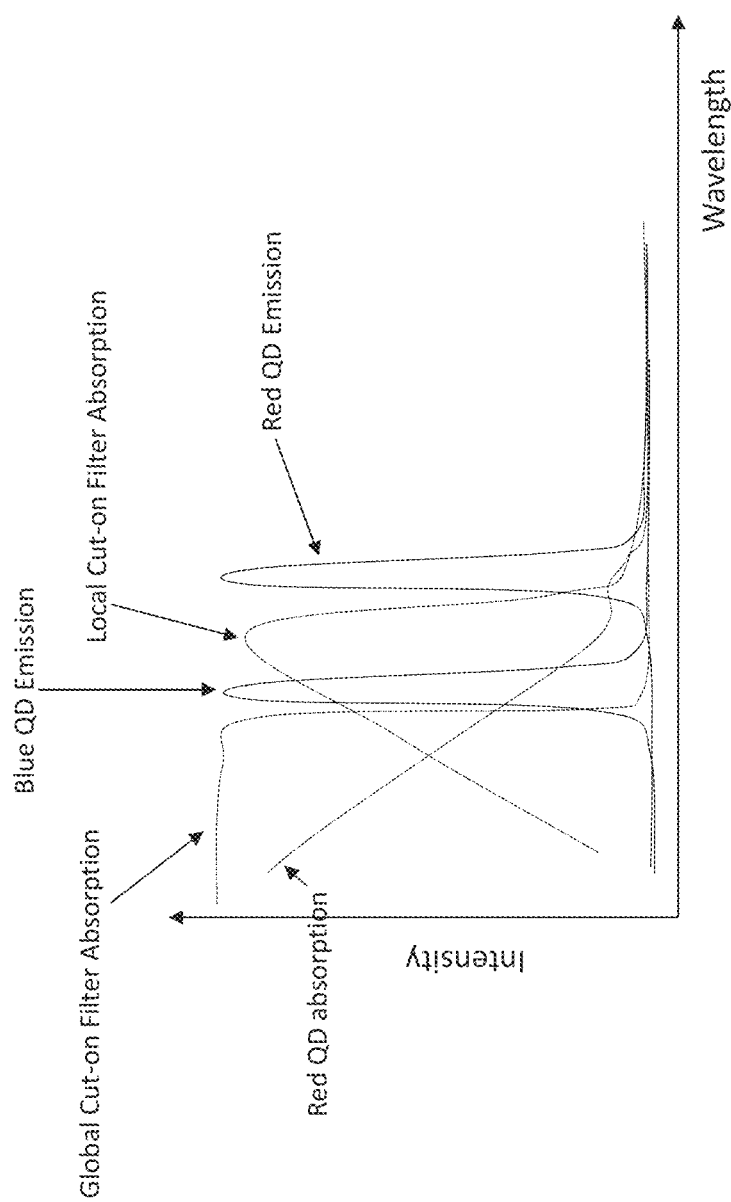
FIG. 3H shows the absorbance spectrum of a global cut-on filter layer; the absorbance spectrum of a red sub-pixel-specific local cut-on filter layer; the absorbance spectrum of the red-emitting QDs in a light-emitting layer; the emission spectrum of the red-emitting QDs in the light-emitting layer for a red sub-pixel; and the emission spectrum of blue-emitting QDs in a blue light-emitting layer (or, alternatively, the blue light emission spectrum for a blue BLU transmitted through a blue sub-pixel).

In some embodiments of the LCD devices, a global cut-on filter layer is combined with local cut-on filter layers. In such devices ambient light having wavelengths shorter than the blue emission wavelengths of the display device will be blocked by the global cut-on filter layer. However, light having wavelengths longer than the blue emission wavelengths, but shorter than the emission wavelengths of the QDs at the respective sub-pixel location can still cause excitation of the QDs. A local cut-on filter which blocks only this particular part of the optical spectrum can, in conjunction with a global cut-on filter, eliminate (or significantly reduce) the excitation of the QD by ambient light. At the same time, a local cut-on filter with said properties will block excess blue light from the BLU, which was not absorbed by the QD color filter. By this process the color saturation and the color gamut of the display can be enhanced. An embodiment of a display device that incorporates a local cut-on filter layer and a global cut-on filter layer is illustrated in FIGS. 3F and 3G, and the spectral function of the system is shown in FIG. 3H.

FIG. 3F is a schematic illustration of the upper layers of an LCD device. FIG. 3G is a cross-sectional side view of the upper layers, including the blue, green, and red sub-pixels in the QD color filter. In this embodiment of the LCD device, the QD color filter has the same structure as that shown in FIG. 3D and the global cut-on filter layer overlies all of the sub-pixel cells. As discussed above, the global cut-on filter layer acts as an additional filter for ambient incident light; absorbing radiation at wavelengths below the shortest emission wavelengths of the device, for example, below the blue emission wavelengths of the device. In the embodiment of the LCD shown in FIGS. 3F, 3G and 3H, the red sub-pixels include local cut-on filter layers that acts as band-pass filters for ambient incident light. Analogous local light filter layers can be included in the green and/or blue sub-pixels.

In addition to, or as an alternative to, providing local filters as layers separate from the QD-containing layers in the QD color filters, the light absorbing materials can be incorporated into the QD color filter layer by including them in an QD-containing ink composition, inkjet printing the ink composition as a QD-containing layer in a sub-pixel cell, and curing the printed ink composition. It should be understood that, although not depicted here, the light absorbing materials, QDs, and, optionally, any GSNPs and/or PSNPs can be included in a single ink composition and printed as a single layer in a sub-pixel cell in which the light absorbers and QDs are uniformly distributed. However, in such embodiments, it may be desirable to select the light absorbing material and the polymer matrix material such that they do not fully prevent the transmission of blue light. Suitable light absorbers for inclusion in the local light filter layers include organic dye molecules, such as azo dyes, inorganic pigments, and combinations thereof.

A process of inkjet printing a QD color filter including a plurality of green, red, and blue sub-pixels is shown schematically in FIG. 2C, whereby a green color filter ink composition, $CFI_G$, is printed directly into the sub-pixel cell for a green sub-pixel using a first inkjet printing nozzle, a blue color filter ink composition, $CFI_B$, is printed directly into the sub-pixel cell for a blue sub-pixel using a second inkjet printing nozzle, and a red color filter ink composition, $CFI_R$, is printed directly into the sub-pixel cell for a red sub-pixel using a third inkjet printing nozzle. Alternatively, the different color sub-pixels can be printed sequentially using the same inkjet printing nozzle. Each of the color filter ink compositions contains its respective color emitting QDs in an organic polymeric binder material, an organic solvent, or mixture thereof. The curable organic polymeric binder materials cure to form a polymer matrix material and can include various organic monomers, oligomers, and/or polymers, as discussed in more detail below. In addition, the color filter ink compositions can include a crosslinking agent, a photoinitiator, or both.

Figure 4A:
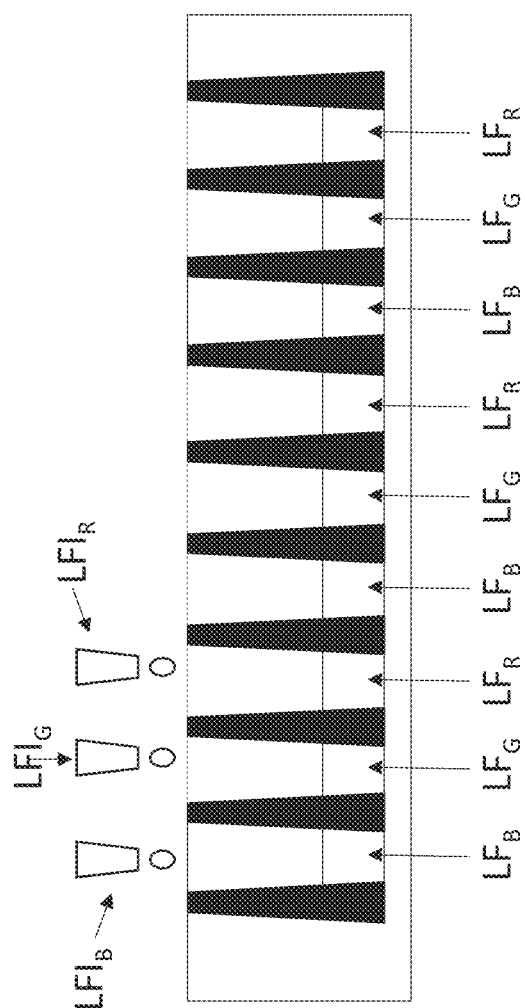
FIG. 4A shows a process of inkjet printing the local light filter layers in the sub-pixel cells of a QD color filter.
Figure 4B:
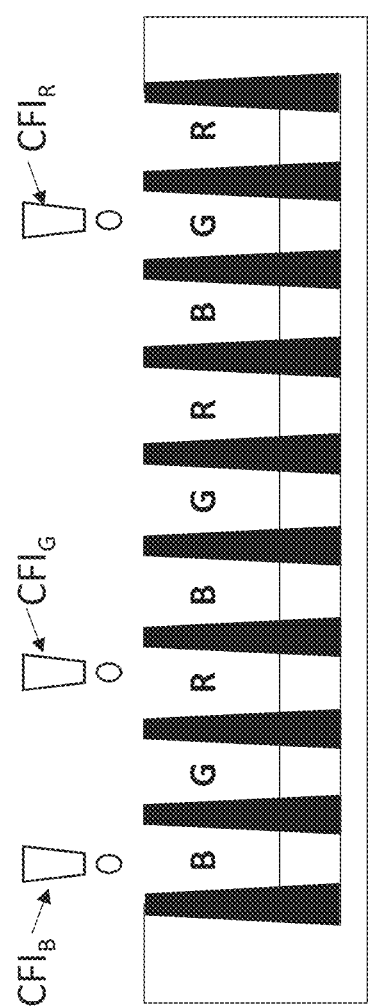
FIG. 4B shows a process of inkjet printing the QD-containing light-emitting layers in the sub-pixel cells of a QD color filter.

A process of inkjet printing a QD color filter having local light filter layers is shown schematically in FIGS. 4A and 4B, whereby the local light filter layers are printed in the sub-pixel cells prior to printing the QD-containing light-emitting layers. As shown in FIG. 4A, a green local light filter ink composition, $LFI_G$, is printed directly into the sub-pixel cell for a green sub-pixel using a first inkjet printing nozzle (or a first set of nozzles), a blue local light filter ink composition, LFI$_B$, is printed directly into the sub-pixel cell for a blue sub-pixel using a second inkjet printing nozzle (or a second set of nozzles), and a red local light filter ink composition, LFI$_R$, is printed directly into the sub-pixel cell for a red sub-pixel using a third inkjet printing nozzle (or a third set of nozzles). Alternatively, the different color sub-pixels can be printed sequentially using the same inkjet printing nozzle (set of nozzles). Each of the local light filter ink compositions contains its respective light absorbing material in a binder material, a solvent, or mixture thereof. The curable binder materials cure to form a matrix material and can include various organic monomers, oligomers, and/or polymers, as discussed in more detail below. In addition, the local light filter ink compositions can include a crosslinking agent, a photoinitiator, or both. Once the sub-pixel-specific local light filter layers are formed in the bottoms of their respective sub-pixel cells, the QD-containing light emitting layers can be printed over the cured or dried local light filter layers, as illustrated in FIG. 4B. After the final assembly of the display, the color filter substrate faces outside and the QD-containing layers face the interior of the display.

In various alternative processes for printing the QD-containing layers and the layers containing the light absorbing materials a single ink composition containing a mixture of the QDs and the light absorbing materials is applied (e.g., inkjet printed) as a single layer initially and dried in such a manner that a layer containing the light absorbing materials separates from a layer containing the QDs, resulting in a two-layer structure. For example, if the QDs are capped with long carbohydrate ligands, it is possible to phase separate them out with a suitable solvent before the remaining light absorber-containing portion of ink composition dries. Alternatively, the solubility of the light absorbing material could be selected such that this material (or the matrix in which it is dissolved) crashes out first, due to the solubility limits of the material.

QD-Containing Color Enhancement Layers

The present inventors have recognized that inkjet printing techniques can be used to provide innovative QD-containing CEDs. Various CEDs of the present teachings include quantum dots dispersed in a matrix. The CEDs can be formed as continuous or discontinuous inkjet printed layers using QD-containing inkjet printable ink compositions. As a result, the composition, geometry, and location of the CEDs can be precisely tailored for a variety of device applications. By incorporating QDs of appropriates sizes and materials in appropriate concentrations and ratios into the CEDs, the CEDs can be designed to alter the absorption and/or emission spectra of photonic devices that incorporate the CEDs.

Figure 5:
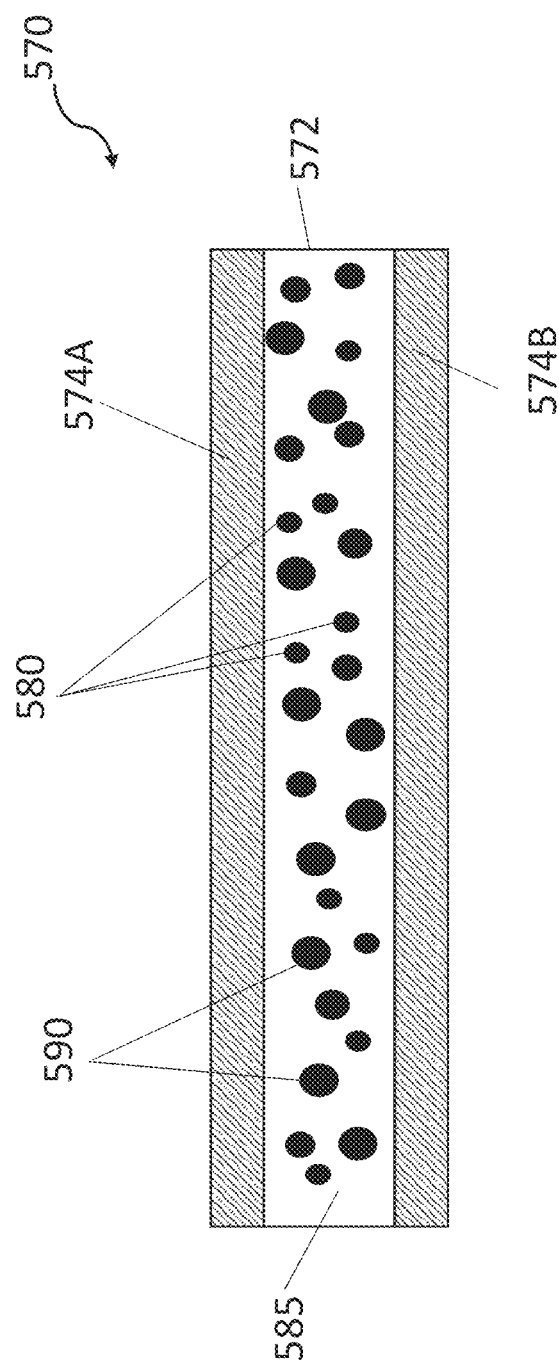
FIG. 5 shows a cross-sectional side view of a quantum dot-containing layer disposed between two protective layers for a color enhancement device.

A cross-sectional view of a basic embodiment of a CED 570 is depicted schematically in FIG. 5. This CED includes a QD-containing layer 572 that contains a plurality of QDs 580, 590 in a matrix 585, such as a polymer matrix. QD-containing layer 572 optionally can be positioned between first and second protective layers, 574A and 574B, respectively. QD-containing layer 572, as depicted, has a plurality of green-emitting QDs 580, shown as smaller spheres, as well as a plurality of red-emitting QDs 590, shown as larger spheres. As shown in FIG. 5, green-emitting QDs 580 and red-emitting QDs 590 are dispersed through matrix 585, which can be, for example, a polymeric matrix capable of transmitting light in the visible spectrum. Moreover, first and second protective layers 574A and 574B provide protection for the QDs embedded in QD-containing layer 572, given the sensitivity of QDs to atmospheric gases, such as water vapor, oxygen and ozone. In various embodiments of the CED, first and second protective layers 574A and 574B can be a polymeric film, such as polyethylene terephthalate (PET), acrylate-based polymeric film, or the like, or an inorganic barrier layer, or combination of the two. Like QD matrix 585, the protective film needs to be capable of transmitting light in the visible spectrum.

Depending on the devices into which they are incorporated, the CEDs of the present teachings can enhance the visual experience of an end user by enhancing the color gamut of light output by the device; and/or enhance the efficiency of the device to provide improved optical clarity and brightness to an end user. Similarly the layer can also improve the absorption efficiency of radiation incident on the device. For example, a QD-containing layer can be inkjet printed onto a surface of a photovoltaic cell, such that a portion of the radiation incident on the cell is converted into wavelengths that are more efficiently absorbed by the photoactive material of the cell. By way of illustration, blue and/or ultraviolet (UV) light incident upon the QD-containing layer in a silicon solar cell can be absorbed by the QDs and emitted as red light, which is more efficiently absorbed by the silicon. In the photovoltaic cells, the QD-containing layer can be printed directly onto the photoactive material or on the surface of another component, such as an anti-reflection coating or an electrode.

Figure 6:
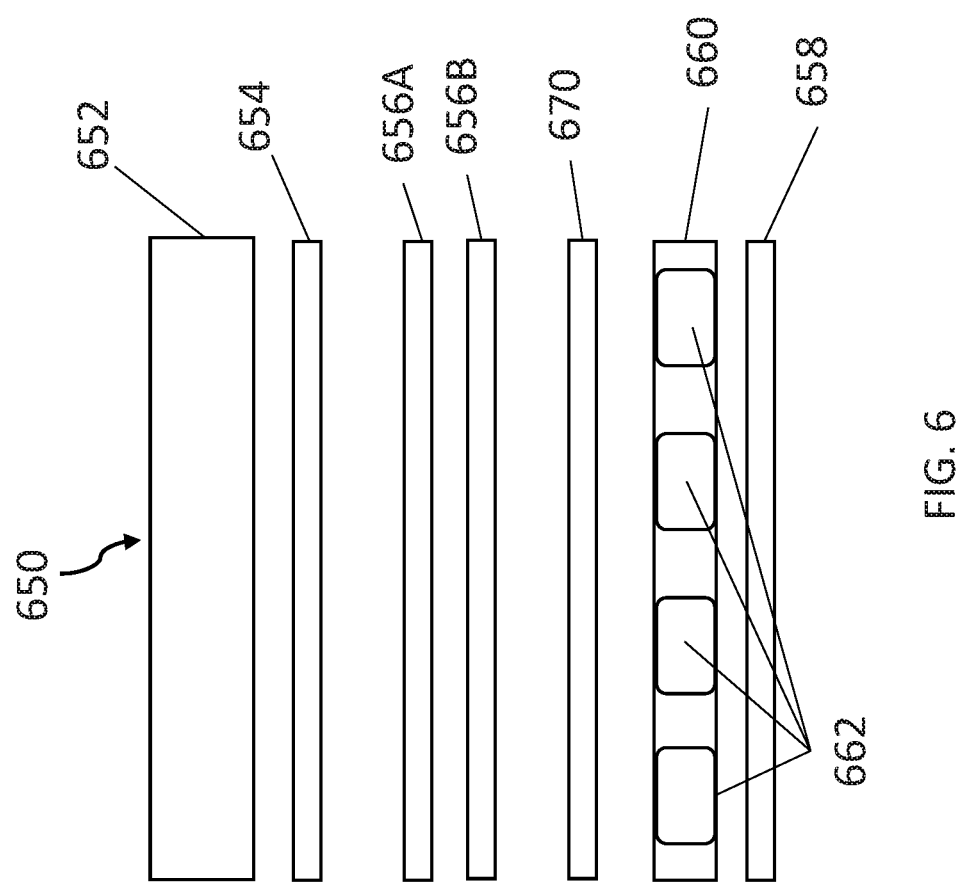
FIG. 6 illustrates generally a schematic exploded perspective view of the components of an LCD device.

In the LCD devices, the QD-containing layer can be printed directly onto a light guide surface or onto the surface of another component, such as a reflector, a diffuser, or a polarizer. FIG. 6 illustrates generally an exploded perspective view of one embodiment of an LCD device 650 into which a CED can be incorporated. LCD device 650 can have LCD panel 652. LCD panel 652 itself can be comprised of many component layers, which can include, for example, but not limited by, a thin film transistor (TFT) layer, a liquid crystal layer, a color filter array (CFA) layer, and a linear polarizer. Additional component layers can include another polarizer 654, first and second brightness enhancement films 656A and 656B, respectively, and reflector film 658. LCD device 650 includes light guide plate 660, which can include a plurality of LED devices 662 positioned proximal to an end of light guide plate 660 as sources of light that can be propagated through light guide plate 660. For various LCD devices, the LED devices associated with a light guide plate can be either white or blue LED sources, though as will be discussed herein subsequently, for LCD device 650, the plurality of LED devices 662 can be blue emitting LEDs with, for example, but not limited by, an emission line at 445 nm.

Figure 7:
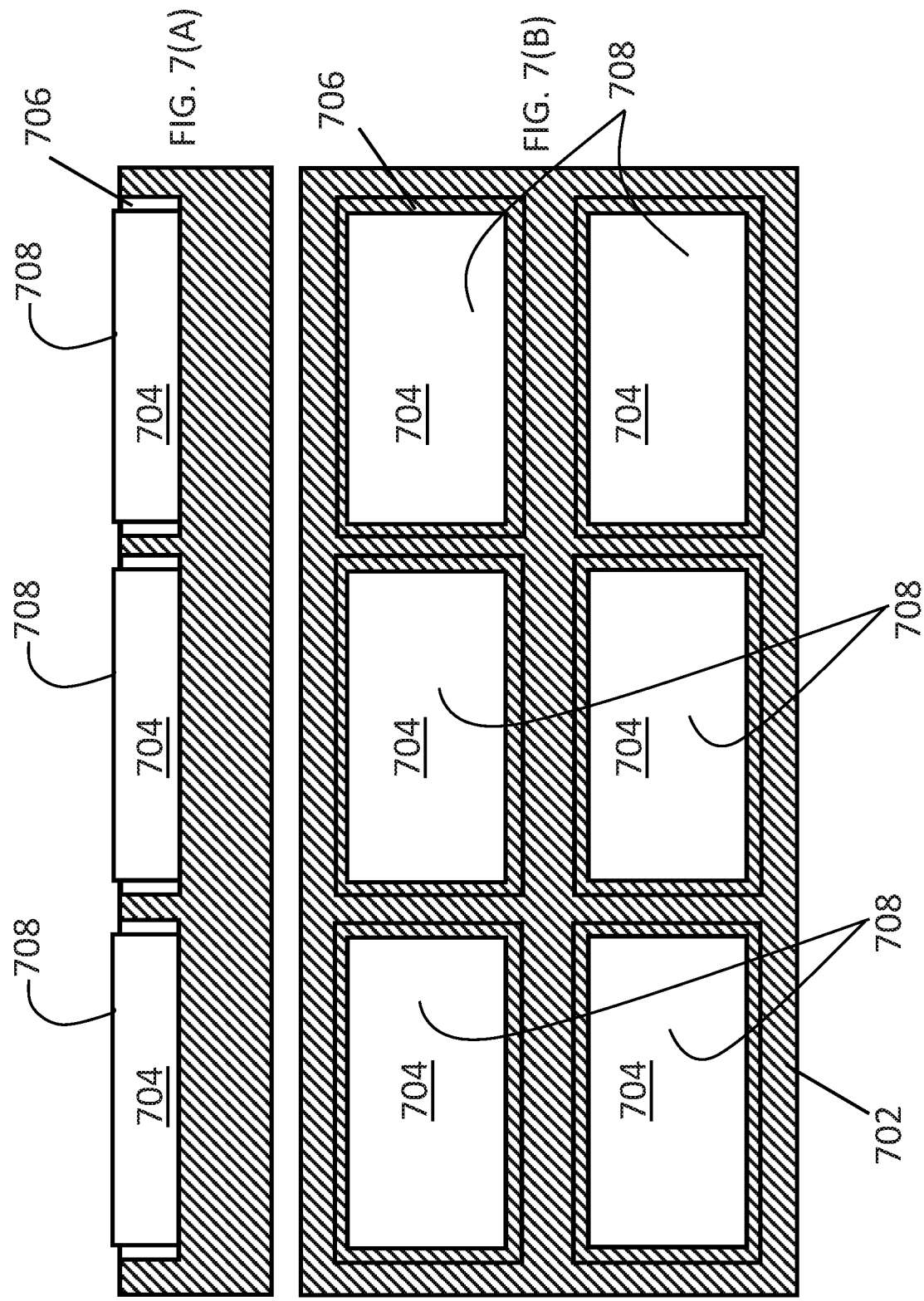
FIG. 7A shows a cross-sectional side view of a substrate tray for inkjet printing a plurality of device substrates.
FIG. 7B shows a top view of the substrate tray of FIG. 7A.

A plurality of device layers can be inkjet printed onto a plurality of substrates simultaneously, or in rapid succession, with or without a controlled delay between the successive printing steps using a substrate tray that holds the substrates in place and that moves with respect to the inkjet printhead during the inkjet printing process. This is illustrated schematically in FIG. 7A and FIG. 7B, which show a cross-sectional side view and a top view, respectively, of a substrate tray 702 holding a plurality of device substrates 704 disposed in an array. Device substrates 702 can be, for example, light guides, reflectors, diffusers, polarizers, layers of anti-reflective material, or electrodes. The shape of the substrate is not limited to rectangular shapes. For example, wafers, as used in the semiconductor industry, can also be processed. Substrate tray 704 includes a plurality of securing features that prevent device substrates 704 from sliding around on the surface of the substrate tray when the tray is in motion. The securing features can take on a variety of forms. In the embodiment shown in FIGS. 7A and 7B, the securing features are a plurality of recessed areas 706 defined in the upper surface 708 of substrate tray 704. A device substrate can be placed in each recessed area without the need for an additional mechanism for fixing the substrates to the tray. Alternatively, the securing features can include locking mechanisms that fix the substrates to the tray and/or provide for precise positioning and alignment of the substrates in select locations on the tray. For example, a spring loaded pin can be placed between device substrate 704 and the wall of its recessed area 706 to prevent the substrate from moving around in the recessed area.

If the alignment of the device substrates on the tray is critical and the tolerances of the securing features are not sufficiently high, the device substrates can be placed in precise alignment on the substrate trays using alignment sensors with sensory feedback and then locked into place on the tray by a locking mechanism. This sensor-aided alignment can be carried out after the substrate tray has been transferred to the inkjet printer but prior to inkjet printing the QD-containing layers or before the substrate tray has been transferred to the inkjet printer.

In addition to the QDs, the QD-containing layer can contain GSNPs, PSNPs, or a combination thereof. Alternatively, the GSNPs and/or PSNPs can be contained in one or more separate layers in the CED. When the GSNPs and/or PSNPs are incorporated in a QD-containing layer they can improve the conversion performance of that layer. In addition, the GSNPs and PSNPs provide enhanced light extraction, by acting as light scattering centers in the matrix of the QD-containing layer and/or in a separate layer in the CED. Including GSNPs and/or PSNPs in combination with the QDs can increase the color conversion efficiency of a CED by increasing light scattering in the interior of the quantum dot layer, so that there are more interactions between the photons and the scattering particles and, therefore, more light absorption by the QDs. Like the QDs, the GSNPs and PSNPs can be incorporated into a CED by including them in an ink composition, and depositing them by inkjet printing the ink composition as a layer, as described above with respect to QD color filters.

The QD-containing layers and/or scattering nanoparticle-containing layers in a CED can be continuous or discontinuous and can have a uniform distribution or a non-uniform distribution of QDs and/or scattering particles along their lengths and/or through their thicknesses. Similarly, QD-containing layers and/or scattering particle-containing layers in a CED can have a uniform or a non-uniform thickness along their lengths. The use of a non-uniform QD or scattering nanoparticle distribution or a non-uniform layer thickness can be used, for example, to offset a non-uniform intensity distribution of the QD-exciting light in the layer. For example, the use of a gradient concentration of the QDs and/or the scattering nanoparticles in a given layer can provide a more uniform light emission and/or color spectrum along the length of a CED by compensating for any non-uniformity in the intensity of the light entering the QD-containing layer. This is illustrated for various embodiments of a CED in an LCD panel assembly in the embodiments that follow.

For simplicity, and with the exception of FIG. 12, in the figures described below, scattering nanoparticles are represented with open circles and quantum dots are represented by solid (filled) circles. The scattering nanoparticles represented by the open circles can be only GSNPs, only PSNPs, or a mixture of GSNPs and PSNPs and are referred to generically as SNPs. In addition, some of the embodiments illustrated in the figures include a QD-containing layer that does not include any SNPs. Although not depicted in all of the figures, any QD-containing layer can also include SNPs (GSNPs, PSNPs, or both) as an alternative to—or in addition to—any separate SNP-containing layers.

Figure 8:
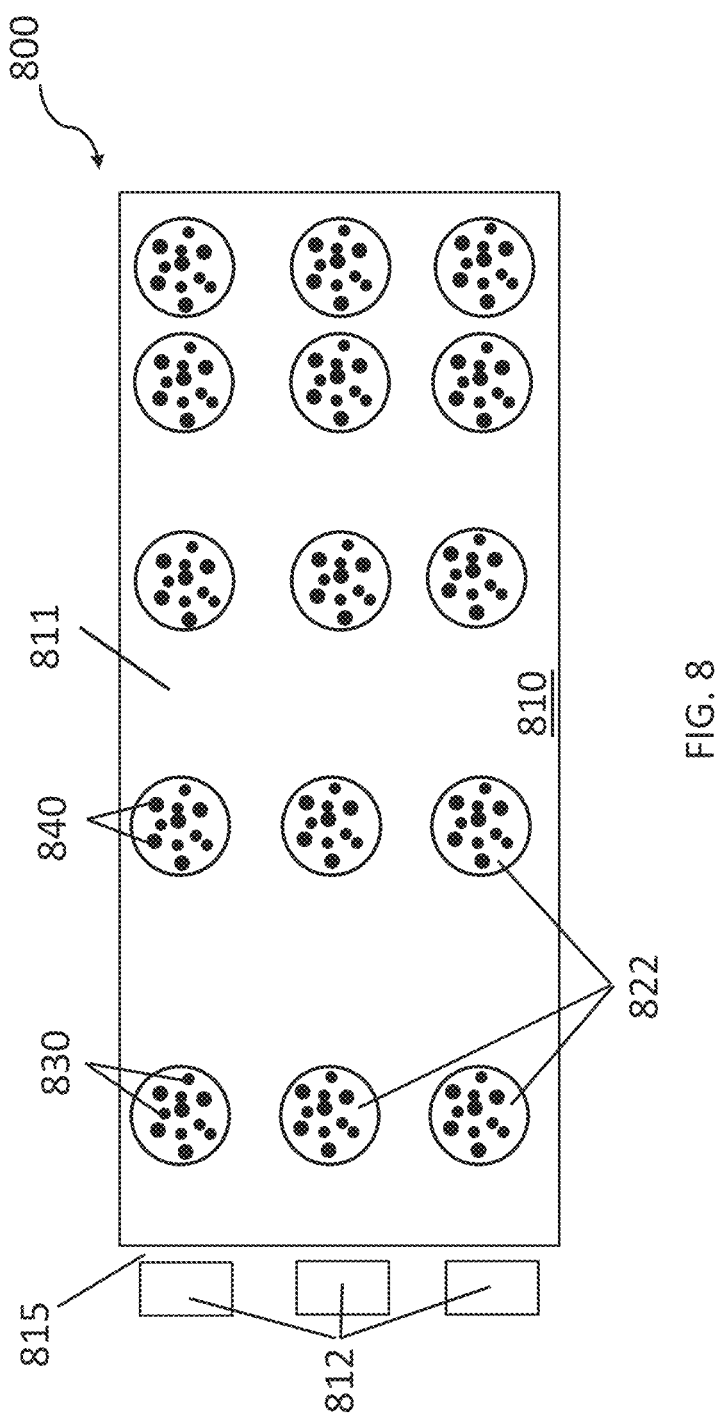
FIG. 8 shows a top view of one embodiment of an edge lit CED having a discontinuous quantum dot-containing layer.

FIG. 8 is a top plan view of CED 800 that incorporates QD materials into the subassembly of an LCD device using inkjet printing. Similar to the combination of light guide plate 660 and QD-containing layer 670 of FIG. 6, CED 800 can be used as a subassembly to achieve the same improvements. In this embodiment, CED 800 has a non-uniform QD-containing layer composed of a patterned array of QD-containing structures 822 deposited in confinement regions upon light guide plate 810. Inkjet printing is used to locally deposit QD-containing structures 822 onto first surface 811. The local density of these structures is controlled by the inkjet printing pattern. The number of QDs per QD-containing structure can be controlled by the QD concentration in the ink composition, by the inkjet drop volume, and/or by the number of inkjet drops per QD-containing structure. Surface treatment of first surface 811 before the printing process can be used to tailor the local wetting properties on the surface and, as a result, can control the size and the shape of the printed QD-containing structures. The surface treatment can be performed in a patterned fashion to increase printing resolution and structure profile. Light guide plate 810 is illuminated by LEDs 812 positioned at a near end edge 815. In this edge lit configuration, the intensity of the light in light guide plate 810 decreases along its length. As a result, light that is out-coupled from light guide plate 810 enters QD-containing structures 822 with a non-uniform light intensity distribution, wherein the intensity of the light out-coupled into the QD-containing structures closer to near end edge 815 is greater than the intensity of the light out-coupled into those that are close to far end edge 816. For this reason, the local density of QD-containing structures 822 has a gradient along the length of light guide plate 810, with a lower density of QD-containing structures 822 at near end edge 815 and a higher density of QD-containing structures 822 at the opposite edge of light guide plate 810. This arrangement of the QD-containing structures can compensate for the decrease in light intensity along the length of light guide plate 810, thereby generating a more uniform emission along the length of the CED. Though FIG. 8 depicts an ordered array of QD-containing structures 822 having a density gradient distribution, for various embodiments of CEDs of the present teachings utilizing QD-containing structures, any pattern of confinement regions having any of a variety of shapes and aspect ratios can be formed on the first surface 811 of light guide plate 810. Moreover, the size and packing density of the QD-containing structures can be determined by the manner in which a defined pattern of ink confinement regions is fabricated. In various embodiments of an array of QD-containing structures, the array is fabricated to provide a microlens array.

Figure 9:
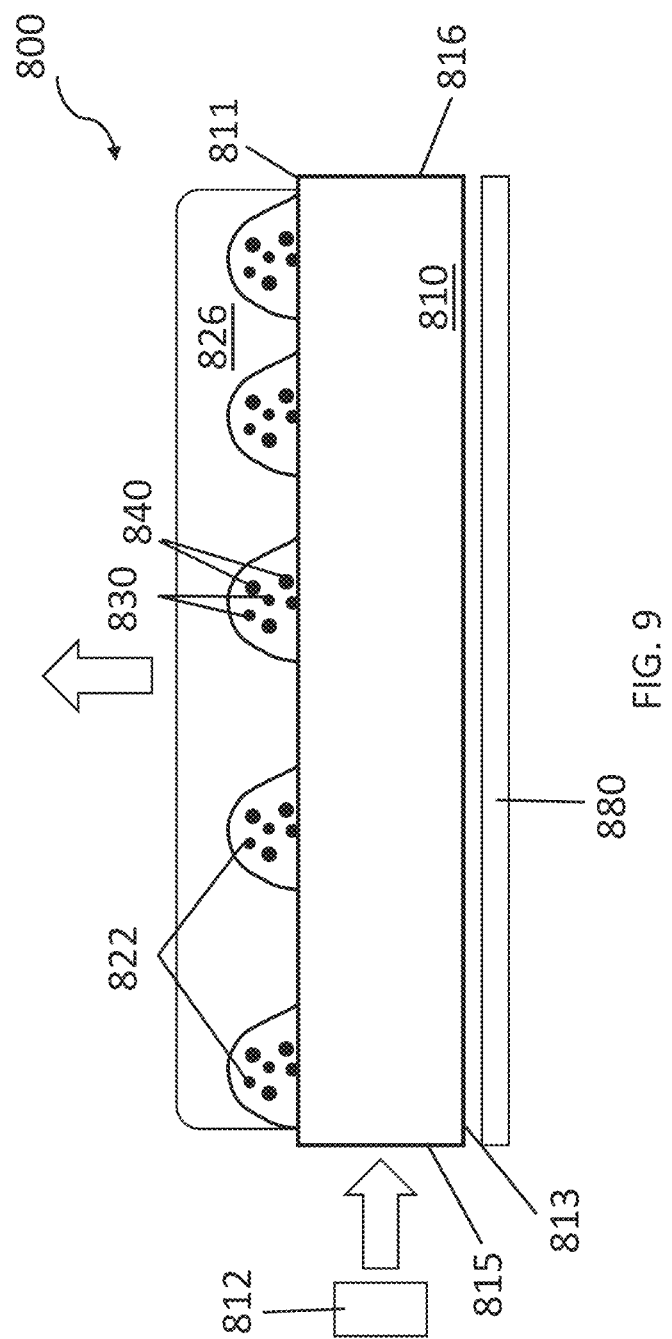
FIG. 9 shows a cross-sectional side view of the CED of FIG. 8.

FIG. 9 is a schematic cross-sectional view of CED 800. In the devices of FIG. 8 and FIG. 9, LED 812 can be a blue-emitting LED with, for example, but not limited by, an emission line at 445 nm. The QD-containing structures 822 in this embodiment of the CED are dome-shaped, but they can have any arbitrary shape. Each structure contains a plurality of QDs, where smaller QDs designated as QD 830 are green-emitting QDs and larger QDs designated as QD 840 are red-emitting QDs. The CED optionally includes a reflector 880 adjacent to a second surface 813 of light guide plate 810. Reflector 880 may be attached to light guide plate 810 using an optically clear adhesive (OCA); desirably one that has a refractive index that is the same as, or nearly the same as, that of the light guide plate.

As depicted in FIG. 9, CED 800 can include protective layer 826 deposited over the array of QD-containing structures 822. Protective layer 826 can be a thick layer that encapsulates the QD-containing layer. For example, protective layer 826 can be between about 1 μm to about 100 μm in thickness. Protective layer 826 can be a thick polymeric layer, such as polyethylene terephthalate (PET), or an acrylate-based polymeric film. It should be noted that when the protective layer is polymeric, it can be deposited using inkjet printing, as exemplified by US Patent Publication 2016/0024322.

Figure 10:
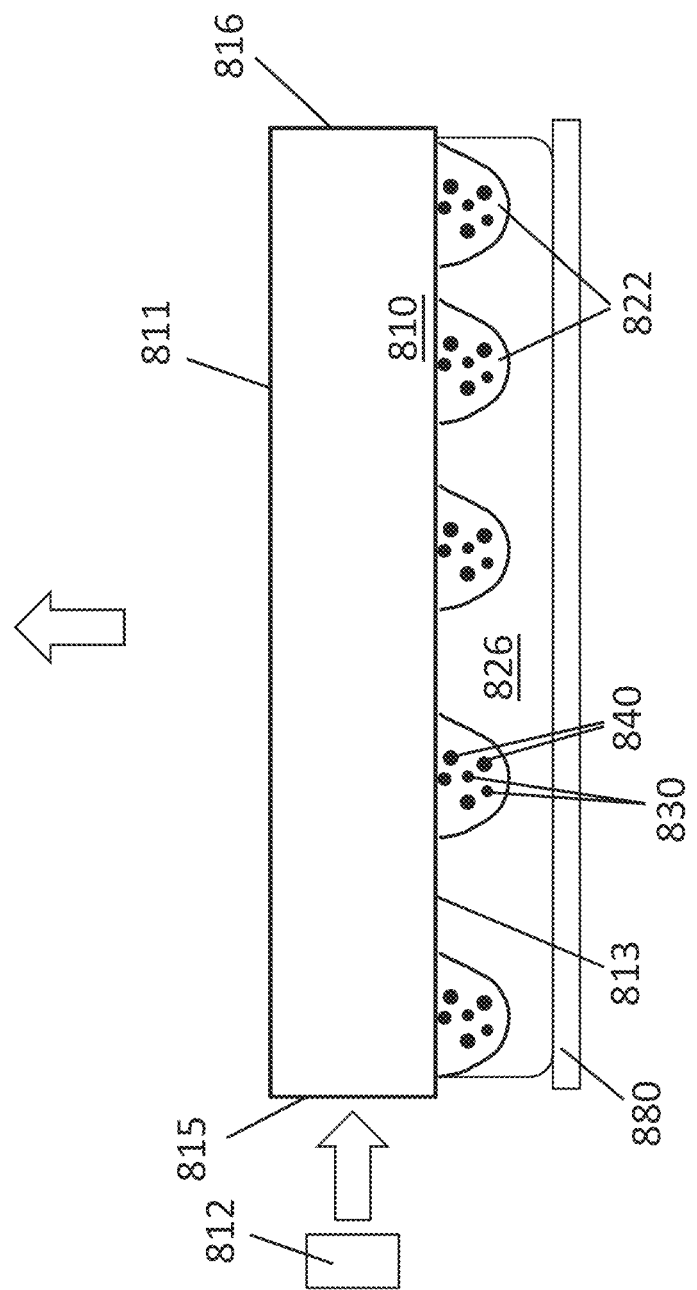
FIG. 10 shows a cross-sectional side of another embodiment of an edge lit CED having a discontinuous quantum dot-containing layer.

An alternative embodiment of a CED having LEDS 812 illuminating its near end edge 815 is shown in FIG. 10. As indicated by the use of like numerals, the components of this CED can be the same as those shown in FIG. 9, but in this embodiment the discontinuous QD-containing layer composed of QD-containing structures 822 and protective layer 826 have been printed onto second surface 813 of light guide plate 810, such that light emitted through second surface 813 passes through QD-containing structures 822 and protective layer 826, is reflected from reflector 880, and passes back through QD-containing structures 822, protective layer 826, and light guide plate 810 before exiting the CED through first surface 811. A similar geometry can be achieved by printing QD-containing structures 822 and protective layer 826 directly onto the surface of reflector 880 that faces light guide plate 810, rather than onto second surface 813 of light guide plate 810. After the protective layer has been printed on the reflector, the reflector can be laminated onto the second surface of the light guide plate.

In variations of the CEDs shown in FIGS. 8, 9, and 10 the QD-containing structures can be uniformly spaced along the length of the light guide plate, but the concentration of QDs in the QD-containing structures can be tailored, such that the concentration of QDs in the QD-containing structures increases as a function of distance from the near end edge of the light guide plate.

Figure 11:
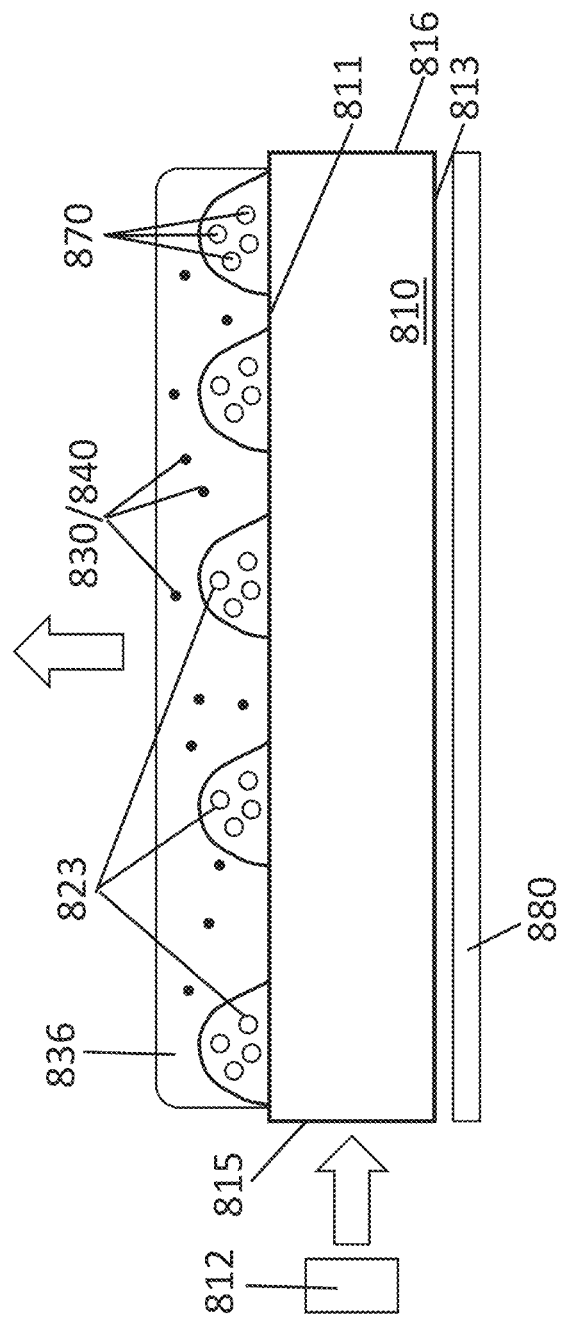
FIG. 11 shows a cross-sectional side view of an embodiment of an edge lit CED having a discontinuous scattering nanoparticle-containing layer and a separate quantum dot-containing layer.

FIG. 11 illustrates a CED that the outcoupling functionality and color conversion functionality can be separated into adjacent layers. In this embodiment, SNPs 870 are dispersed in a discontinuous layer composed of a plurality of SNP-containing structures 823. These structures provide the outcoupling functionality of the device. Like QD-containing structures 822 in FIG. 9, SNP-containing structures 823 are dome-shaped, although they can have any arbitrary shape, and are distributed with a density gradient along the length of light guide plate 810. In this embodiment, QDs 830/840 are dispersed in the matrix of a continuous QD-containing layer 836 providing the color conversion functionality of the device. The effect of the SNP concentration gradient in this embodiment, and in other embodiments, of the CED is to improve the uniformity of the light intensity out-coupled from light guide plate 810 into QD-containing layer 836 and, ultimately, also the uniformity of the intensity of the light exiting the CED.

In a variation of the CED shown in FIG. 11 the SNP-containing structures can be uniformly spaced along the length of the light guide plate, but the concentration of SNPs in the SNP-containing structures can be tailored, such that the concentration of SNPs in the SNP-containing structures increases as a function of distance from the near end edge of the light guide plate.

For simplicity, continuous QD-containing layer 836 is depicted in this and other embodiments as containing QDs having the same size. However, it should be understood that the QD-containing-layers in the CEDs would include different types of QDs, including green-emitting QDs, red-emitting QDs, blue-emitting QDs, and combinations of two or more thereof.

Figure 12:
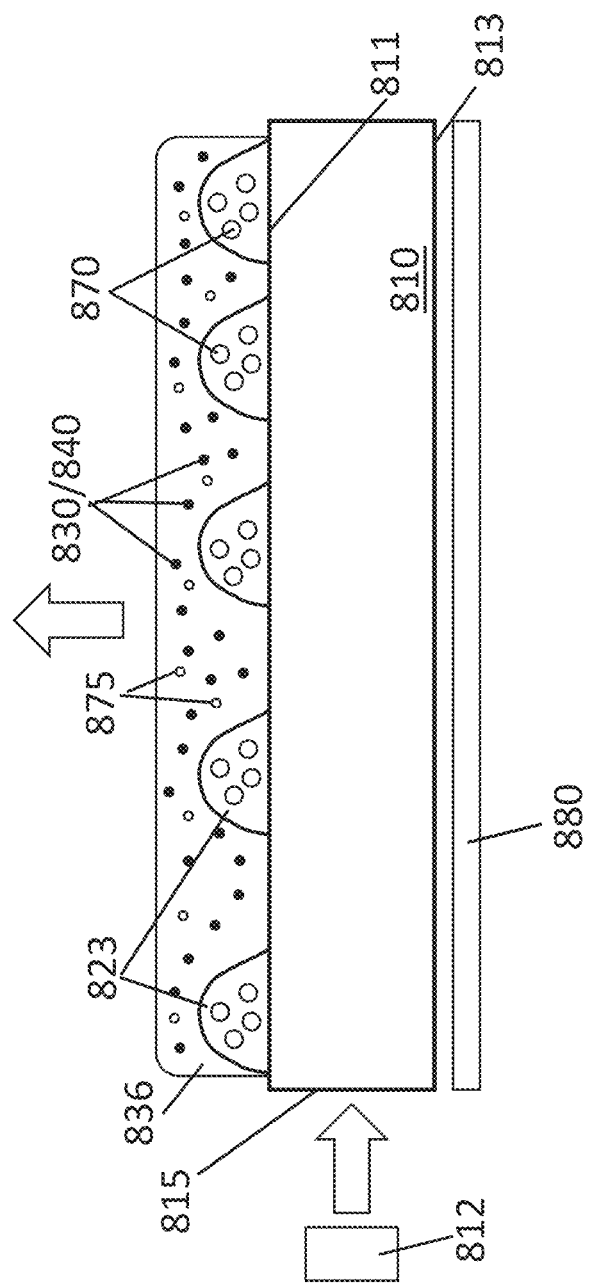
FIG. 12 shows the CED of FIG. 11 having plasmonic scattering nanoparticles in the quantum dot-containing layer.

FIG. 12 is provided to explicitly depict one example of a CED that includes both GSNPs and PSNPs. Thus, unlike in the other figures discussed herein, GSNPs and PSNPs are represented by differently sized open circles. In particular, the larger open circles in FIG. 12 are used to represent GSNPs, while the smaller open circles are used to represent PSNPs. In the embodiment depicted in FIG. 12, QD-containing layer 836 includes PSNPs 875 dispersed in its matrix and GSNPs 823 are included in a separate, discontinuous layer.

Figure 13:
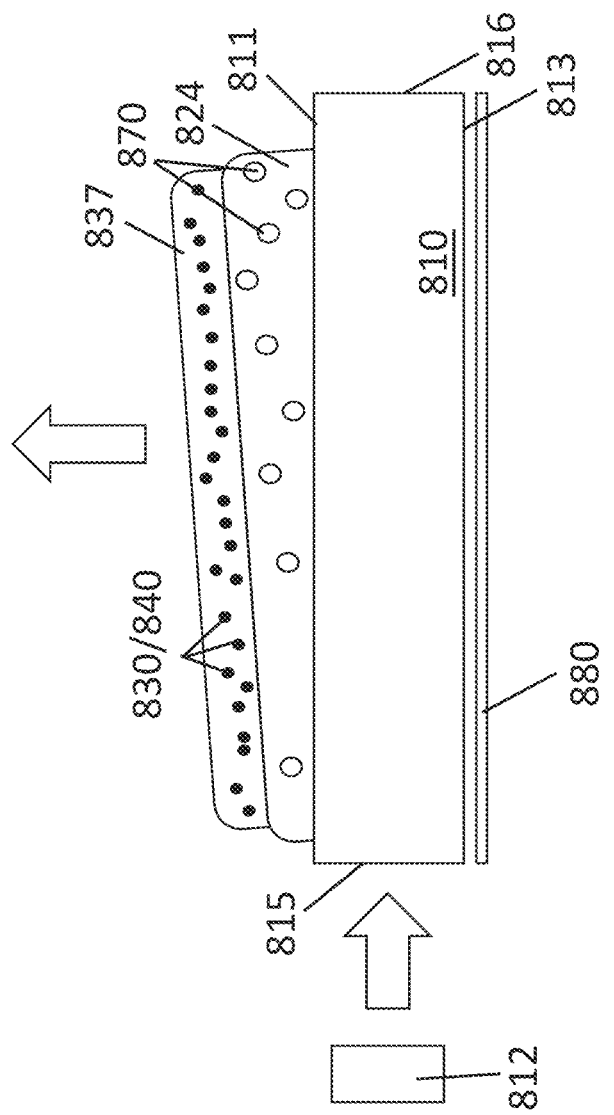
FIG. 13 shows a cross-sectional side view of an embodiment of an edge lit CED having a continuous scattering nanoparticle-containing layer, with a variable thickness along its length, and a separate quantum dot-containing layer.

FIG. 13 shows an embodiment of a CED in which the SNPs 870 are dispersed in a continuous SNP-containing layer 824 and the QDs are dispersed in a separate, continuous QD-containing layer 837 overlying SNP-containing layer 824. In embodiments of the CEDs where the scattering nanoparticles and the quantum dots are located in separate layers, the intensity of the light outcoupled from the layer containing the SNP has a uniform intensity distribution, even when the light outcoupled from the light guide plate does not—as in the case of a light guide plate that is illuminated by a light source at its end edge. Because the light outcoupled from the layer containing the SNPs has a uniform intensity along its length, the QD-containing layer need not have a QD concentration gradient.

In the embodiment shown in FIG. 13, continuous SNP-containing layer 824 has been printed directly onto first surface 811 of light guide plate 810 and continuous QD-containing layer 837 has been printed directly on continuous SNP-containing layer 824. In this configuration, light emitted through first surface 811 passes through SNP-containing layer 824 and scatters from SNPs 870 to cause the outcoupling of the light to QD-containing layer 837. In order to compensate for the higher light intensity from near end edge 815 of light guide 810, there is a gradient in the density of SNPs 870 along the length of SNP-containing layer 824, whereby the density of the SNPs increases as a function of distance from near end edge 815. To further compensate for the non-uniform light intensity emitted from light guide plate 810, SNP-containing layer 824 also has a variable thickness along its length, whereby the thickness of the SNP-containing layer increases as a function of distance from near end edge 815. An alternative geometry can be achieved by printing SNP-containing layer 824 directly onto second surface 813 of light guide plate 810 and printing QD-containing layer 837 onto first surface 811 of light guide plate 810; or by printing SNP-containing layer 824 directly onto the surface of reflector 880 that faces light guide plate 810 and printing QD-containing layer 837 onto first surface 811 of light guide plate 810.

Figure 14:
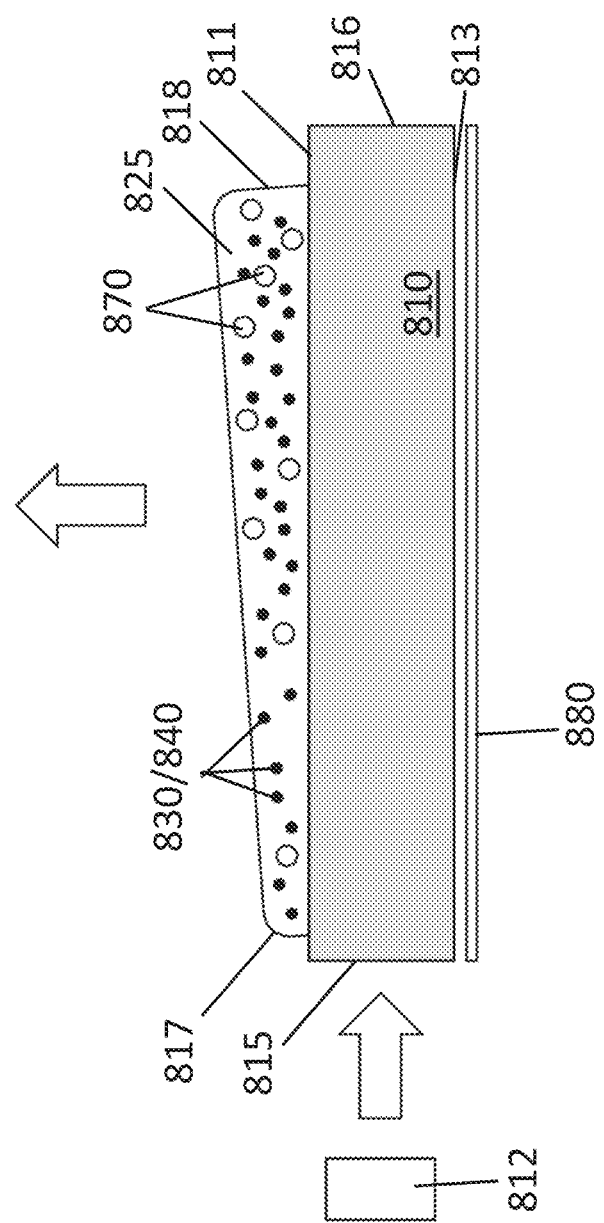
FIG. 14 shows a cross-sectional side view of an embodiment of an edge lit CED having a continuous layer that contains both quantum dots and scattering nanoparticles and has a variable thickness along its length.

FIG. 14 shows a variation of the CED of FIG. 13 in which the QDs 830/840 and the SNPs 870 are combined in a single layer, which is referred to herein as a QD/SNP-containing layer 825. Like SNP-containing layer 824 in the CED of FIG. 13, QD/SNP-containing layer 825 has a gradient in the density of SNPs 870, as well as a variable thickness, along its length. Also, like QD-containing layer 837 in the CED of FIG. 13, QD/SNP-containing layer 825 has a uniform QD concentration along its length. However, due to the wedge-shaped profile of QD/SNP-containing layer 825, the surface density of QDs 830/840 (that is—the density of QDs per $mm^2$, as viewed through the top surface of the layer) increases from near end edge 817 to far end edge 818. An alternative geometry can be achieved by printing QD/SNP-containing layer 825 directly onto second surface 813 of light guide plate 810; or by printing QD/SNP-containing layer 825 directly onto the surface of reflector 880 that faces light guide plate 810. This structure can be achieved, for example, by simultaneously printing with two different inks (a first ink containing the QDs and a second ink containing the SNPs). Alternatively, a layer could be printed using the first ink followed by a layer using the second ink, followed by interdiffusion of these printed layers yield layer 825.

Figure 15:
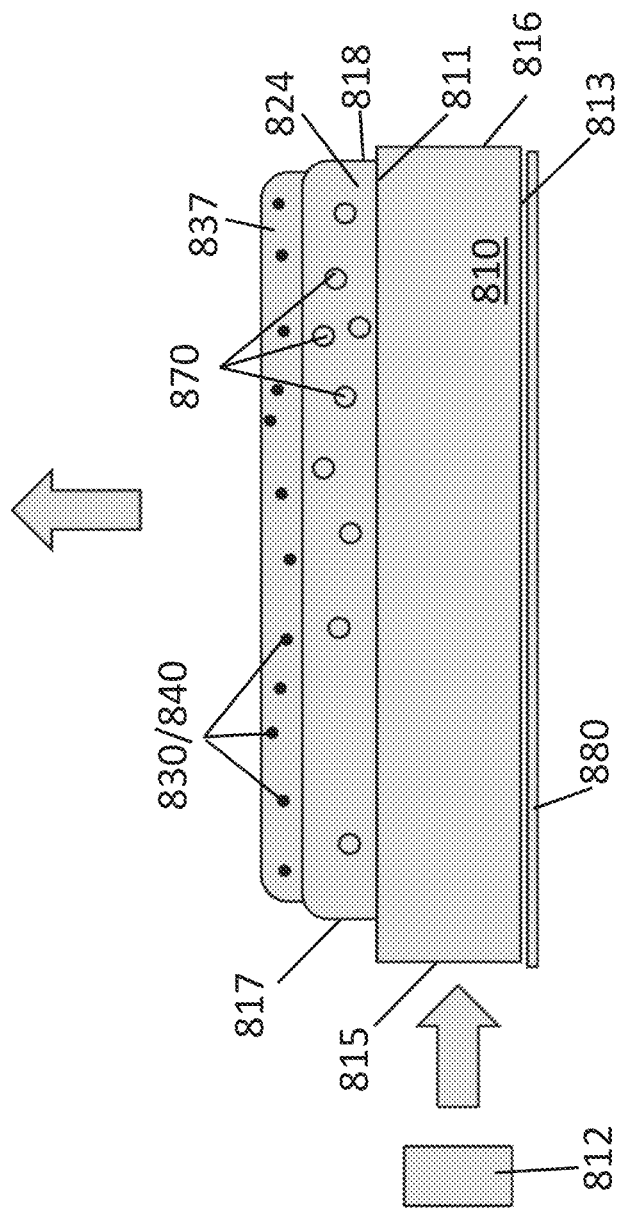
FIG. 15 shows a cross-sectional side view of an embodiment of an edge lit CED having a continuous scattering nanoparticle-containing layer, with a uniform thickness along its length, and a separate quantum dot-containing layer.
Figure 16:
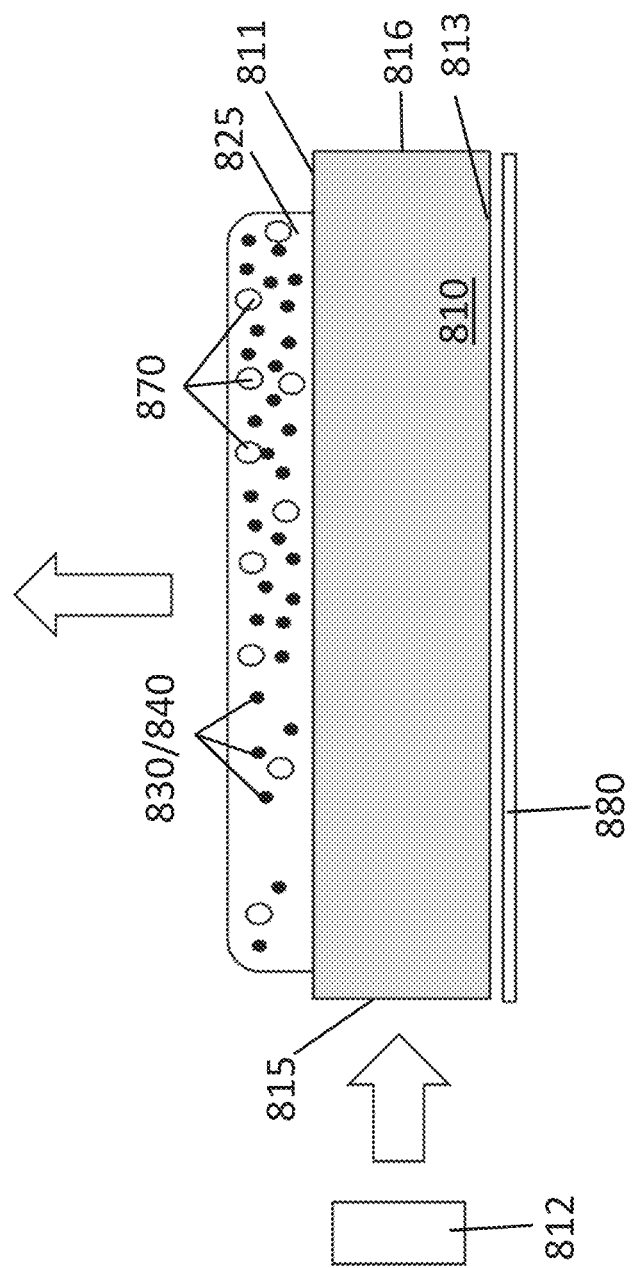
FIG. 16 shows a cross-sectional side view of an embodiment of an edge lit CED having a continuous layer that contains both quantum dots and scattering nanoparticles and has a uniform thickness along its length.
Figure 17:
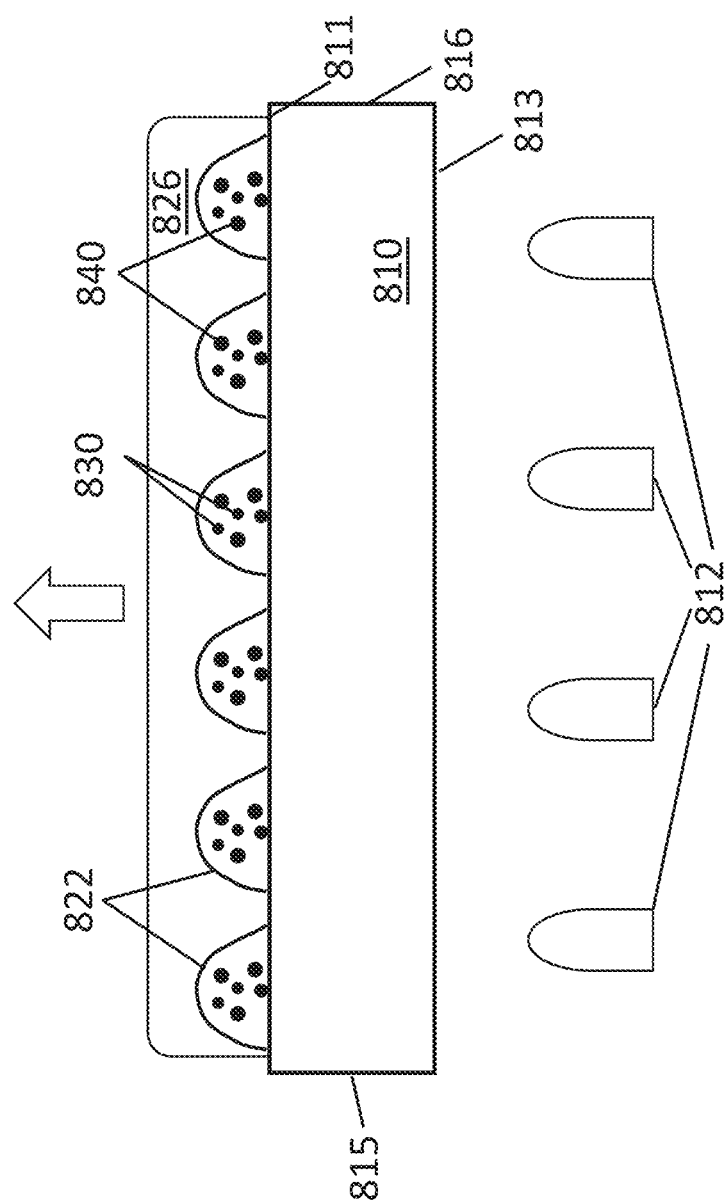
FIG. 17 shows a cross-sectional side view of an embodiment of a back lit CED having a discontinuous quantum dot-containing layer.
Figure 18:
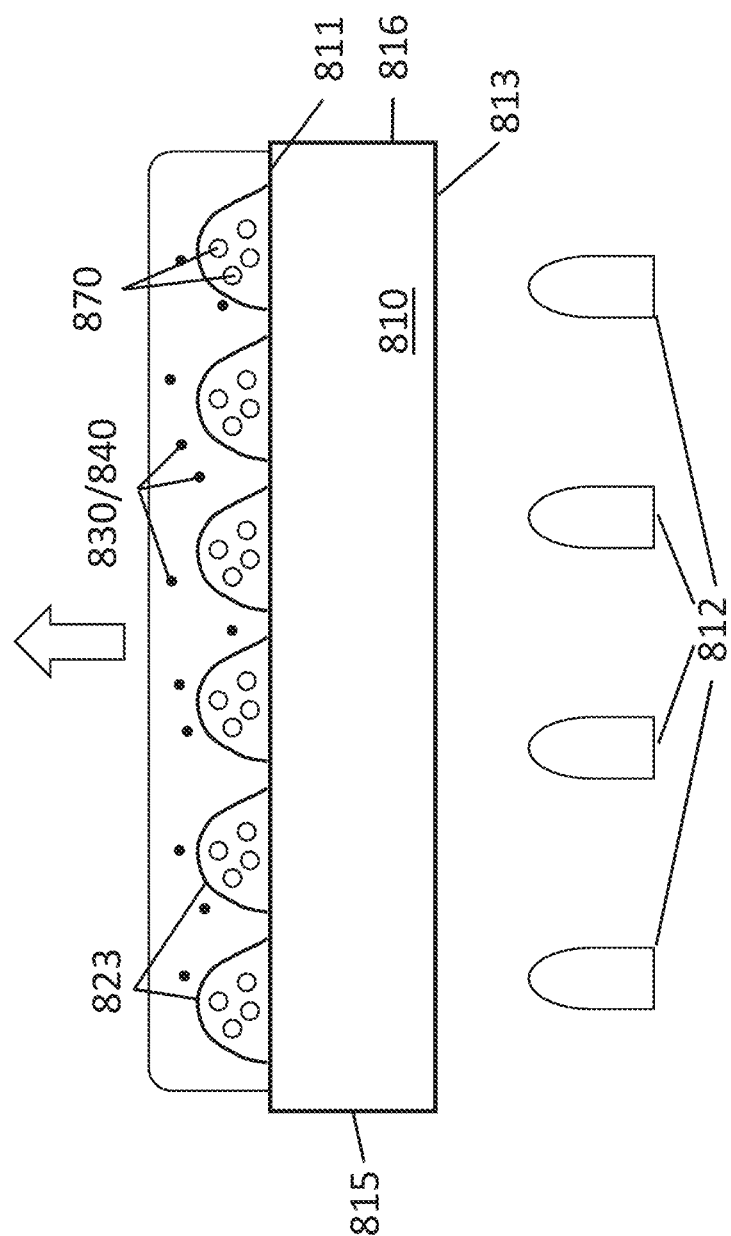
FIG. 18 shows a cross-sectional side view of an embodiment of a back lit CED having a discontinuous scattering nanoparticle-containing layer and a separate quantum dot-containing layer.
Figure 19:
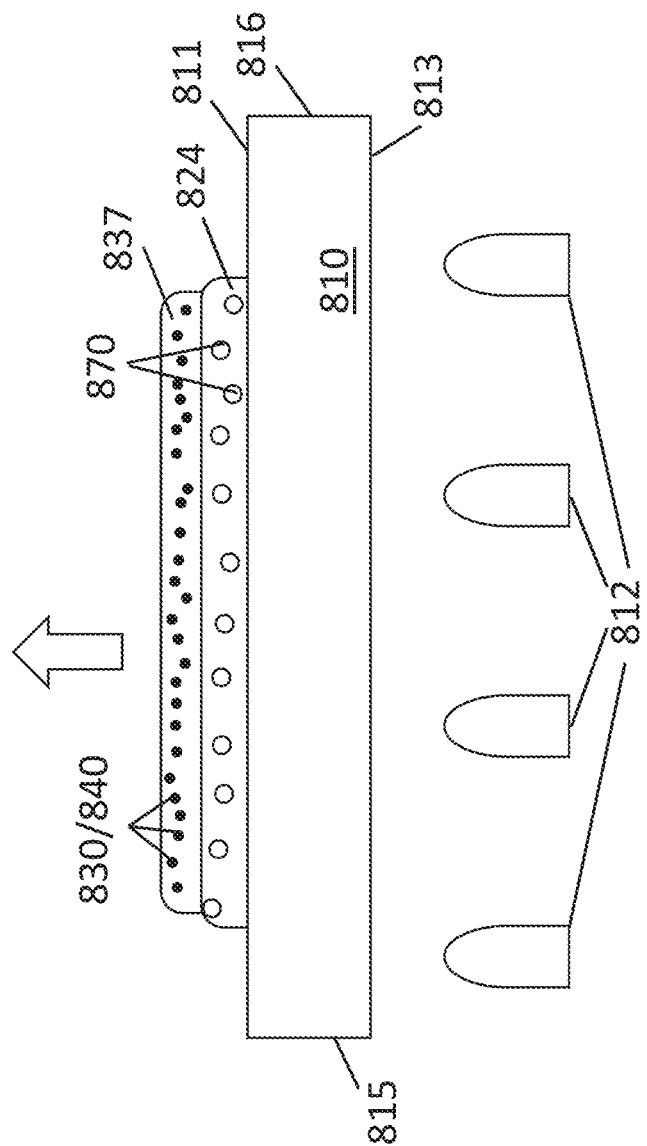
FIG. 19 shows a cross-sectional side view of an embodiment of a back lit CED having a continuous scattering nanoparticle-containing layer, with a uniform thickness along its length, and a separate quantum dot-containing layer.
Figure 20:
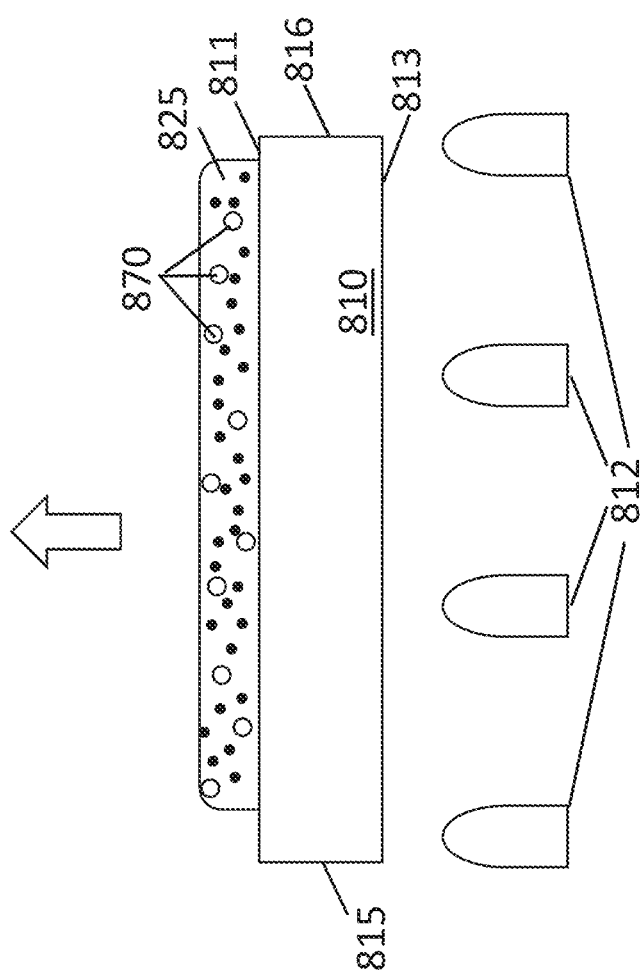
FIG. 20 shows a cross-sectional side view of an embodiment of a back lit CED having a continuous layer that contains both quantum dots and scattering nanoparticles and has a uniform thickness along its length.

FIGS. 15 and 16 show variations of the CEDs of FIGS. 13 and 14, respectively, in which the SNP-containing layer 824 (in the case of FIG. 15) and QD/SNP-containing layer 825 (in the case of FIG. 16) have a uniform thickness along their lengths.

Although the concentration gradients for the QDs and/or the SNPs in the CEDs of FIGS. 9-16 show a particle concentration that increases linearly or substantially linearly from a near end edge to a far end edge, other particle concentration patterns can be used to provide a non-uniform particle concentration through all or a portion of a printed layer. For example, the particle concentration can increase exponentially across the layer or may have a regular or irregular periodic variation across the layer. By way of further illustration, the concentration of QDs and/or scattering nanoparticles can increase from the far end edge of a layer to the near end edge of the layer; from the top of a layer to the bottom of the layer; from the bottom of a layer to the top of a layer, or from a peripheral portion of the layer to the center of the layer.

FIGS. 17, 18, 19, and 20 show variations of the CEDs of FIGS. 9, 11, 15, and 16, respectively, in which light guide plate 810 is back lit, rather than edge lit. (It is noted again that, although the device substrate is illustrated with a light guide plate in these embodiments, other device substrate could be used, including a diffuser or a polarizer.) In each of these CEDs, LEDs 812 illuminate light guide plate 810 through second surface 813, rather than near end edge 815. In the back lit devices, there is no edge-to-edge gradient in the intensity of light emitted from light guide plate 810. Therefore, QD-containing structures 822 and SNP-containing structures 823 are uniformly spaced along first surface 811 of light guide plate 810 in the CEDs of FIGS. 17 and 18, and SNP-containing layer 824 and QD/SNP-containing layer 825 have a uniform density of SNPs 870 along their lengths in FIGS. 19 and 20. Although not shown here, other embodiments of the edge lit CEDs could also be reconfigured as back lit CEDs, including the embodiments depicted in FIGS. 9, 12, 13, and 14 and their alternative geometries.

Figure 21:
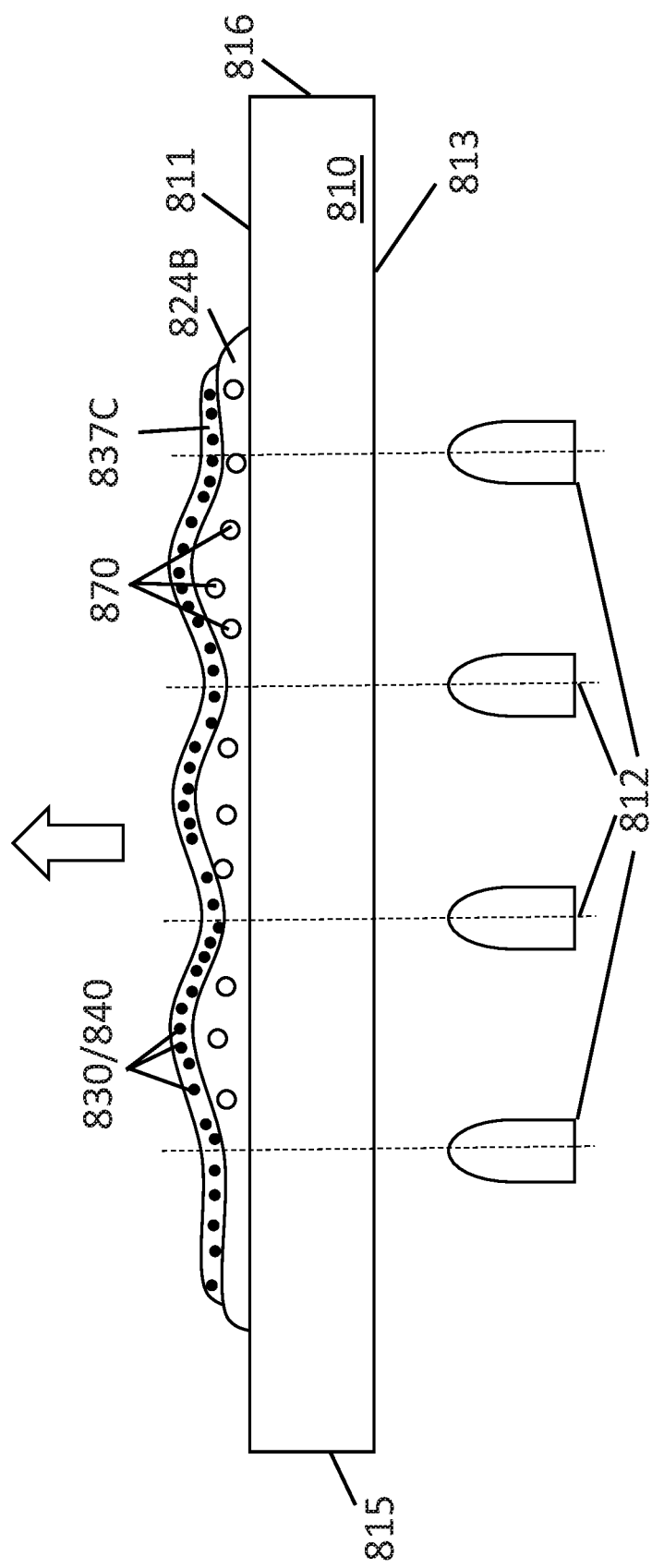
FIG. 21 shows a cross-sectional side view of an embodiment of a back lit CED having a continuous scattering nanoparticle-containing layer, with a thickness modulation along its length, and a separate quantum dot-containing layer, with an optional thickness modulation along its length.

While there is no edge-to-edge gradient in the intensity of the light emitted from surface 811 light guide plate 810 in the back lit CEDs of FIGS. 17-20, the intensity of the light emitted from light guide plate 810 can be non-uniform due to the placement of LEDs 812, with a higher intensity of light entering the portions of the light guide plate disposed directly above the LEDs and a lower intensity of light entering the portions of the light guide plate disposed between the LEDs. FIG. 21 shows an embodiment of a CED that compensates for this intensity non-uniformity. As illustrated in this figure, thicknesses of SNP-containing layer 824B and QD-containing layer 837C can be modulated along their lengths.

A particle-containing layer in a CED can be printed as a continuous layer having a QD concentration gradient, a GSNP concentration gradient, a PSNP concentration gradient, or a combination thereof, via the sequential or simultaneous inkjet printing of three or more different ink compositions. Although the layers depicted in FIGS. 8-16 as having a linear or substantially linear QD and/or SNP concentration gradient along their lengths, the layers can be printed with other gradient patterns, including exponential gradients, as discussed above.

One embodiment of a method for inkjet printing a continuous layer having a QD concentration gradient and/or a SNP concentration gradient utilizes three inks. In some embodiments of these multi-ink printing methods, the first ink composition contains the QDs and a binder; the second ink composition contains the SNP and a binder; and the third ink composition contains a binder, without the QDs or the SNPs. Using this method, the concentration of particles (QDs or SNPs) printed onto a given surface area will be determined by the concentration of the QDs and SNPs in their respective ink compositions and by the volume ratios of the three ink compositions printed over that surface area. The volume of an ink composition can be controlled by controlling the drops of the ink composition printed per area ("DPA"). By way of illustration, a first portion of a layer that is formed by printing the three ink compositions in volumes that satisfy the relationship $(DPA)_{binder} > (DPA)_{SNP} > (DPA)_{QD}$ will have a lower concentration of SNPs and QDs than another portion of the film layer that is formed by printing the three ink compositions in volume ratios that satisfy the relationship $(DPA)_{QD} > (DPA)_{SNP} > (DPA)_{binder}$, provided that the total number of drops per area $(DPA)_{binder}$, $(DPA)_{SNP}$ $(DPA)_{QD}$ remains constant.

The three ink compositions can be printed over the surface of a substrate, such as a light guiding plate, a transparent substrate, a diffuser, or a reflector, simultaneously, sequentially, or a combination thereof. For example, two of the ink compositions can be printed simultaneously and the third can be printed subsequently. If the different ink compositions are intended to form separate and distinct layers in the printed film, the ink compositions can be printed sequentially and allowed to dry or cure prior to the printing of a subsequent layer. Alternatively, if the different ink compositions are intended to form a single blended layer in which the binders and particles in the ink compositions are intermixed, the ink compositions can be printed simultaneously or sequentially. When different ink compositions are printed sequentially and a blended layer is desired, the printing should take place on a timescale that allows the ink compositions to mix into a single layer before the ink compositions is dried or cured into a film.

Figure 22:
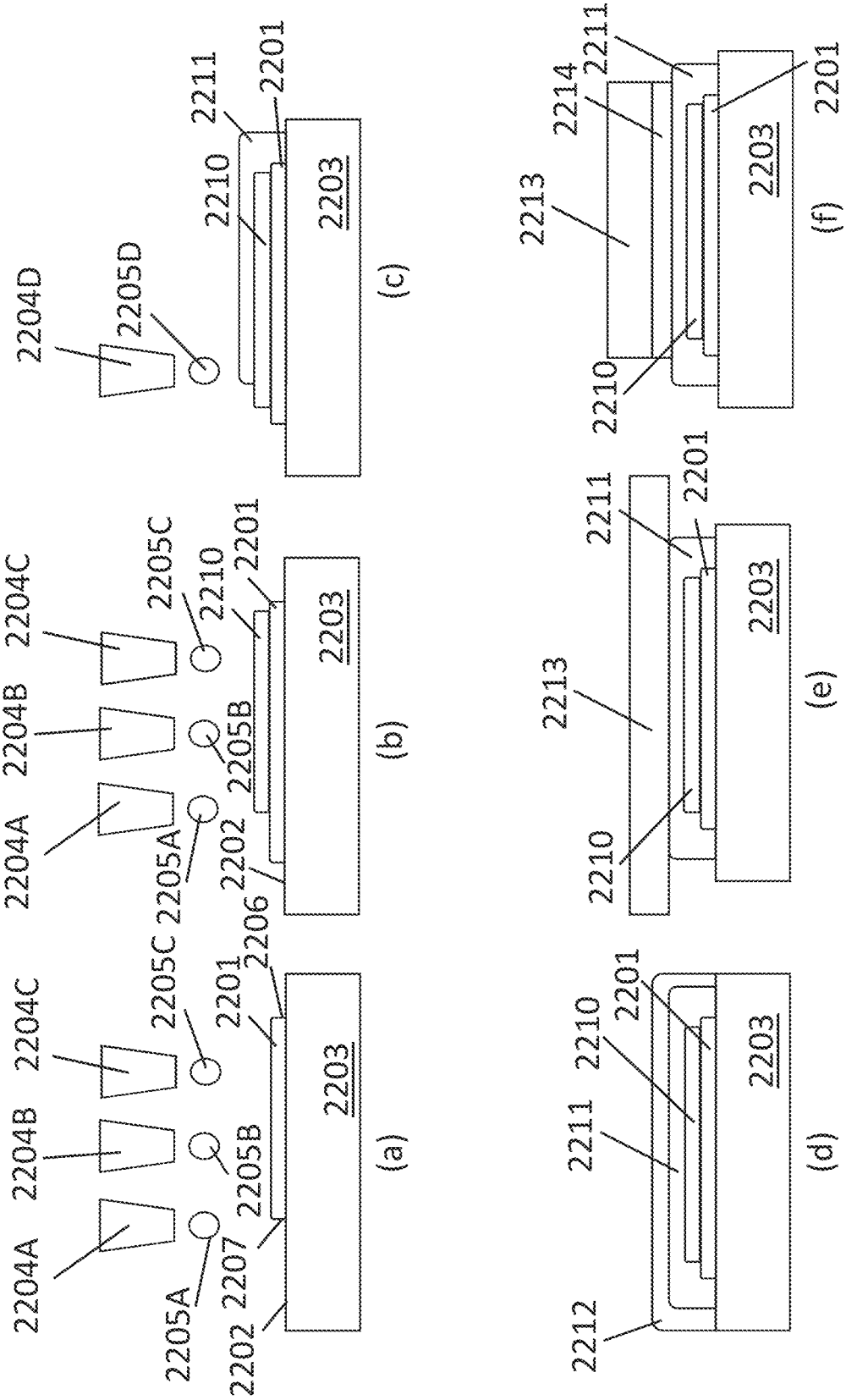
FIG. 22 is a schematic illustration of a method for inkjet printing layers containing quantum dots and scattering nanoparticles on a device substrate.

A method for inkjet printing a QD-containing layer on a substrate surface is illustrated schematically in FIG. 22. The method will be illustrated in the description that follows as a method for inkjet printing a layer containing both QDs and SNPs on a substrate surface, wherein the layer has a concentration gradient in the and SNPs from one edge to the layer to the other. However, the same equipment and general procedure also could be used to print layers containing only QDs or only SNPs by varying the ink compositions used and the order in which the ink compositions are deposited. In addition, the ink compositions used to inkjet print the various layers are described generally with reference to FIG. 22. A more detailed description of ink compositions that can be used to form one of more layers in a CED is provided below.

As shown in panel (a) of FIG. 22, the inkjet printing process can begin by printing a layer of material 2201 onto a surface 2202 of a substrate 2203. As previously discussed, the substrate can take the form of a variety of device substrates, such as a light guide, a reflector, or a polarizer. In the embodiment depicted here, three inkjet nozzles 2204A, 2204B, and 2204C, each of which prints droplets of a different ink composition 2205A, 2205B, and 2205C, are used. By way of illustration, ink composition 2205A can contain a curable polymer binder, without any QDs or SNPs. This ink composition acts as a diluent for the other ink compositions during the printing of later 2201. Ink composition 2205B can contain a curable binder and QDs and ink composition 2205C can contain a curable binder and SNPs. To form printed layer 2201, droplets of ink compositions 2205A, 2205B, and 2205C are jetted from nozzles 2204A, 2204B, and 2204C, respectively, either simultaneously or sequentially onto surface 2202. As the printing progresses from a first edge 2206 to a second edge 2207 of printed layer 2201, the relative volume ratios of the three ink compositions is adjusted so that the desired volumetric densities of the QD and SNP is achieved. For example, the density of the SNPs is lowest at first edge 2206 and higher at second edge 2206, while the volume density of QDs remains constant from edge-to-edge. The polymer binders, which form the matrix of the cured layer, can the same or different for each ink composition. If the ink compositions are to be printed successively and then allowed to mix to form a single layer, the polymer binders should be miscible. Once printed, the layer can be cured by, for example, UV curing, thermal curing, or a combination thereof. Although not shown here, if the QDs and SNPs are inkjet printed as separate layers, the polymer binders can be the same. This may be advantageous for devices in which the layers desirably have the same refractive index.

Optionally, as shown in panel (b) of FIG. 22, a second layer 2210 can be printed over first printed layer 2201 using one of more of inkjet nozzles 2204A, 2204B, and/or 2204C and this layer can also undergo a post-deposition cure. Next a polymeric protective layer 2211 that is free of QDs and SNPs can be inkjet printed over second layer 2210 using an ink composition 2205D jetted from nozzle 2204D that includes a protective, curable polymer (panel (c)). Once cured, polymeric protective layer 2211 helps to protect first layer 2201 and second layer 2210 from exposure to damaging effects of the atmosphere, such as water, oxygen, and/or ozone, and allows the CED to be handled prior to incorporation into a larger device structure. In addition, printed polymeric protective layer 2211 can protect layers 2201 and 2210 from the damaging effects of subsequent device processing steps, such as plasma enhanced chemical vapor deposition (PECVD). For example, as shown in panel (d), PECVD may be used to deposit an inorganic barrier layer 2212 over polymeric protective layer 2211. Inorganic barrier layer, provides an enhanced degree of protection from the atmosphere. In various embodiments, barrier layer 2212 can be a deposited dense layer of an inorganic material, such as selected from classes of inorganic materials including metal oxides, metal nitrides, metal carbides, metal oxynitrides, metal oxyborides, and combinations thereof. For example, but not limited by $SiN_x$, $Al_2O_3$, $TiO_2$, $HfO_2$, $SiO_xN_y$, or combinations thereof can be used for inorganic barrier layer 2212. Alternatively, as shown in panel (e) a polymeric film 2213 can be laminated directly onto polymeric protective layer 2211. (Polymeric film 2213 could also be laminated directly onto inorganic barrier layer 2212 in panel (d).) Laminated polymeric film 2213 can provide an additional degree of protection and can permanently laminated to the structure, such that it is ultimately incorporated into a final device structure, or temporarily attached, such that it is removed prior to the final device assembly. Panel (f) in FIG. 22 illustrates the temporary attachment of laminated polymeric film 2213 to the underlying structure, wherein a coating of optically clear adhesive 2214 is disposed between printed polymeric protective layer 2211 and laminated polymeric film 2213.

While the methods for printing film layers having particle concentration gradients described herein and illustrated in FIG. 22 use at least three ink compositions, more than three ink compositions or fewer ink compositions can be used. For example, the printing methods can use two or more different QD-containing ink compositions having different concentrations or types of the quantum dots, or two or more different scattering nanoparticle-containing ink compositions having different concentrations or types of the scattering nanoparticles. For example, in some embodiment of the printing methods, an ink composition containing PSNPs and a binder can be used along with a separate ink composition containing GSNPs and a binder. Alternatively, only two ink compositions can be used. For example, if a layer containing only one type of particle (e.g., only QDs, only GSNPs, or only PSNPs) is being printed, the first ink composition can contain the particles and a binder and the second ink composition can contain a binder, without the particles. By printing the two ink compositions simultaneously or sequentially and varying the drops per area of the two ink compositions during the printing process, as discussed above with respect to a three-ink composition protocol, a layer having a particle gradient along its length can be achieved. Alternatively, this concept also provides for more than three inks. For example, several inks for SNP with binder can be used where the SNP are PSNP of different particle sizes.

Figure 23:
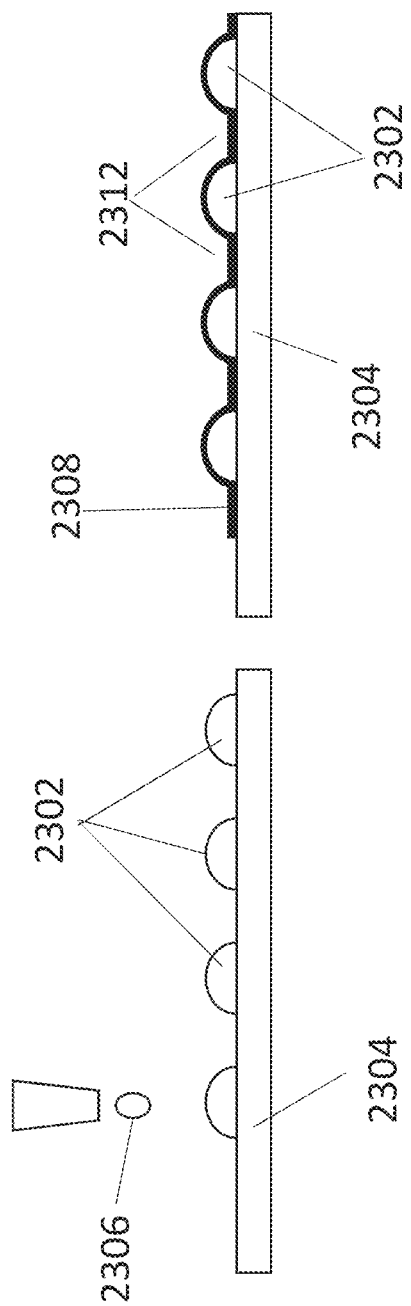
FIG. 23 is a schematic illustration of a method for forming a sealing layer on a substrate and, optionally, also a barrier layer.
Figure 24:
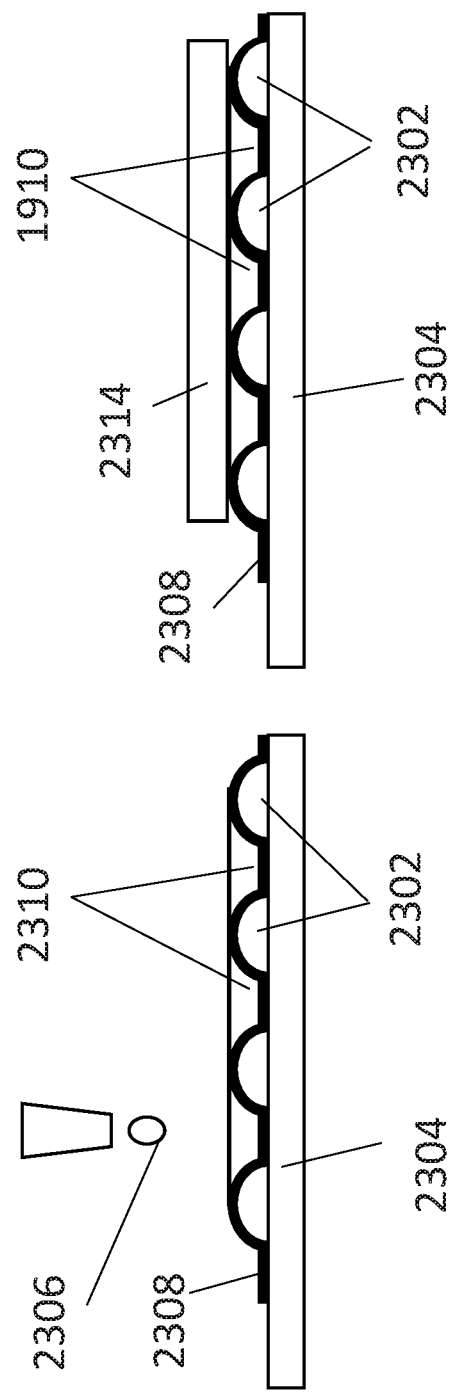
FIG. 24 is a schematic illustration of a method of printing one or more layers of a CED between the sealing banks of a sealing layer and then sealing the CED layers.

For some applications, it can be advantageous to provide a sealing layer around the perimeter of the CED or at least around one or more layers of the CED. These sealing layers can be sealed against another device layer to provide a water and/or oxygen proof edge seal. CEDs fabricated with sealing layers can be cut to size and sealed into a device without the risk of lateral ingress of water and/or oxygen and subsequent damage to the CED. FIGS. 23 and 24 show schematic illustrations of a method for forming a CED having a sealing layer. In this embodiment, the sealing layer includes a plurality of sealing banks 2302 that are inkjet printed onto a substrate 2304 using an ink composition 2306 that includes curable sealing materials, such as curable monomers, oligomers, polymers, or mixtures thereof, and, optionally, SNPs (FIG. 23, left panel). In some embodiments of the sealing layers, sealing banks 2302 have SNPs dispersed therein. In these embodiments, the SNPs can serve to help redirect light from a light source, such as a back-lit unit, into a QD-containing layer printed between the sealing banks (as described below). Like the QD- and SNP-containing layers of the CED, described above, the SNPs within the sealing banks or in different sealing banks can have a non-uniform (e.g., gradient) density distribution across the sealing layer in order to provide the CED with more uniform light emission. Although sealing banks 2302 in FIG. 23 are depicted as being inkjet printed, other fabrication methods, such as nano-imprinting can be used to form these banks.

Optionally, a barrier layer 2308 is formed over sealing barriers 2302 and the exposed portions of substrate 2304 (FIG. 23, right panel). This barrier layer, which can be, for example, an inorganic material, such as by $SiN_x$, $Al_2O_3$, $TiO_2$, $HfO_2$, $SiO_xN_y$, or combinations thereof, provides additional protection from water and/or oxygen.

Once the barrier layer has been formed, one or more layers of a CED 2310, including QD-containing layers and/or SNP-containing layers, can be inkjet printed into the recesses 2312 defined between sealing banks 2302, as shown in FIG. 24 (left panel). A temporary or permanent film 2314 can then be sealed to sealing banks 2302 to cover and protect the CED layers 1910 (FIG. 24, right panel).

It should be noted that, while the formation of various device layers is described herein as including a curing step, device layers formed from non-curable compositions may be formed simply by drying.

Ink Compositions

The following teachings relate to various embodiments of ink compositions which, once printed and dried and/or cured, form thin polymeric layers, including, but not limited to, the local light filter layers, the global light filter layers, the light-emitting layers, the light-scattering layers, and/or the color enhancement layers described herein. Various embodiments of the ink compositions can be printed using, for example, an industrial inkjet printing system that can be housed in a gas enclosure, which gas enclosure defines an interior that has a controlled environment maintained as an inert and substantially low-particle process environment. QD-containing light-emitting layers can be inkjet printed over various previously formed device substrates, such as a light polarizer or a local light filter layer of the type disclosed herein, and then cured using, for example, a thermal or ultraviolet (UV) cure.

It is contemplated that a wide variety of ink compositions can be printed within the inert, substantially low-particle environment of various embodiments of a gas enclosure system. By way of illustration, during the manufacture of an LCD device, an LCD sub-pixel can be formed to include the various device layers described herein. Various ink compositions for a sub-pixel can be inkjet printed using ink compositions tailored for the formation of an absorbing dye-containing layer, a QD-containing layer for a red sub-pixel, a green sub-pixel, or a blue sub-pixel, a scattering nanoparticle-containing layer, or a QD-free polymer matrix layer for a blue sub-pixel, as well as a polymeric planarization layer.

Some embodiments of the ink compositions include a polymer component, for example, but not limited by, various acrylate monomers, such as a mono- or multidentate acrylates; various methacrylate monomers, such as a mono- or multidentate methacrylates; and copolymers and mixtures thereof. The polymer component can be cured using thermal processing (e.g. bake), UV exposure, and combinations thereof. As used herein polymer and copolymer can include any form of a polymer component that can be formulated into an ink and cured on a substrate to form an organic layer. Such polymeric components can include polymers and copolymers, as well as precursors thereof, for example, but not limited by, monomers, oligomers, and resins. Some embodiments of the ink compositions further include light absorbers, QDs, GSNPs, PSNPs, and combinations thereof dispersed in the polymer component.

The ink compositions include one or more mono(meth)acrylate monomers, one or more di(meth)acrylate monomers, or a combination of mono(meth)acrylate and di(meth)acrylate monomers, in addition to a multifunctional crosslinking agent. As used herein, the phrase "(meth)acrylate monomer" indicates that the recited monomer may be an acrylate or a methacrylate. Some embodiments of the ink compositions further include crosslinking photoinitiators. Jettable ink compositions of this type that may be used to print one or more of the polymeric film layers—with or without the addition of QDs, scattering particles, and/or light absorbing pigments and/or organic dyes—are described in U.S. patent application publication number 2016/0024322 filed on Jul. 22, 2015 and in U.S. patent application publication number 2017/0062762, filed on Jul. 19, 2016, the entire contents of which are incorporated herein by reference.

The mono(meth)acrylate and di(meth)acrylate monomers are ether and/or ester compounds have thin film-forming properties and spreading properties that render them suitable for use in inkjet printing applications. As components of an ink composition, these monomers can provide compositions that are jettable at a range of inkjet printing temperatures, including room temperature. Generally, for ink compositions useful for inkjet printing applications, the surface tension, viscosity and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 40° C.). Once formulated, various embodiments of the ink compositions can have a viscosity of, for example, between about 2 cps and about 30 cps (including, for example, between about 10 cps and about 27 cps and between about 14 cps and about 25 cps) at 22° C. and a surface tension of between about 25 dynes/cm and about 45 dynes/cm (including, for example, between about 30 dynes/cm and about 42 dynes/cm and between about 28 dynes/cm and about 38 dynes/cm) at 22° C.

The suitable viscosities and surface tensions for the individual monomers used in the ink compositions will depend on the viscosities and surface tensions for the other components present in a given ink composition and on the relative amounts of each component in the ink composition. Generally, however, the mono(meth)acrylate monomers and the di(meth)acrylate monomers will have a viscosity in the range from about 4 cps to about 22 cps at 22° C., including about 4 cps to about 18 cps at 22° C., and a surface tension in the range from about 30 dynes/cm to 41 dynes/cm at 22° C., including in the range from about 32 dynes/cm to 41 dynes/cm at 22° C. Methods for measuring viscosities and surface tensions are well known and include the use of commercially available rheometers (e.g., a DV-I Prime Brookfield rheometer) and tensiometers (e.g., a SITA bubble pressure tensiometer).

In some embodiments of the ink compositions, including embodiments with a high QD and/or scattering nanoparticle loading, organic solvents can be added to adjust the viscosity and/or surface tension of the ink compositions if the viscosity and/or surface tensions of the ink compositions fall outside of these ranges in the absence of organic solvents. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include toluene, xylenes, mesitylene, propylene glycol methyl ethers, methyl naphthalene, methyl benzoate, tetrahydronaphthalene, dimethyl formamide, terpineol, phenoxyethanol, and butyrophenone.

The mono(meth)acrylate monomers and di(meth)acrylate monomers can be, for example, linear aliphatic mono(meth) acrylates and di(meth)acrylates, or can include cyclic and/or aromatic groups. In various embodiments of the inkjet printable ink compositions, the mono(meth)acrylate monomers and/or di(meth)acrylate monomers are polyethers. In various embodiments of the inkjet printable ink compositions, the di(meth)acrylate monomers are alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth)acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

Other suitable (meth)acrylate monomers include, but are not limited to: alkyl (meth)acrylates, such as methyl (meth) acrylate and ethyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth) acrylate; 2(2-ethoxyethoxy)ethyl (meth)acrylate. Other suitable di(meth)acrylate monomers include 1,6-hexanediol diacrylate, 1, 12 dodecanediol di(meth)acrylate; 1,3-butylene glycol di(meth)acrylate; di(ethylene glycol) methyl ether methacrylate; polyethylene glycol di(meth)acrylate monomers, including ethylene glycol di(meth)acrylate monomers and polyethylene glycol di(meth)acrylate monomers having a number average molecular weight in the range from, for example, about 230 g/mole to about 440 g/mole. For example, the ink compositions can include polyethylene glycol 200 dimethacrylate and/or polyethylene glycol 200 diacrylate, having a number average molecular weight of about 330 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

The multifunctional (meth)acrylate crosslinking agents desirably have at least three reactive (meth)acrylate groups. Thus, the multifunctional (meth)acrylate crosslinking agents can be, for example, tri(meth)acrylates, tetra(meth)acrylates and/or higher functionality (meth)acrylates. Pentaerythritol tetraacrylate or pentaerythritol tetramethacrylate, di(trimethylolpropane) tetraacrylate and di(trimethylolpropane) tetramethacrylate are examples of multifunctional (meth) acrylates that can be used as a primary cross-linking agent. The term 'primary' is used here to indicate that other components of the ink compositions may also participate in crosslinking, although that is not their main functional purpose.

Photoinitiators can also, optionally, be included in the ink compositions for initiating the polymerization process. Ink compositions useful for the inkjet printing of local and global light filter layers can further include light absorbing dyes and/or pigments dispersed in the polymer component.

Ink compositions useful for the inkjet printing of QD-containing layers and layers containing scattering particles will further include QDs and/or scattering particles dispersed in the polymer component. The scattering particles can be, for example, GSNPs and/or PSNP. The ink compositions can include more than one type of particle. For examples, various embodiments of the ink compositions contain a mixture of QDs and PSNP; a mixture of QDs and GSNPs; or a mixture of QDs, GSNPs, and PSNPs. The QD-containing ink compositions can include more than one type of QD, for example, an ink composition for a QD-containing layer that will be illuminated using blue light, can include a mixture of red-emitting QDs and green-emitting QDs; an ink composition for a QD-containing layer that will be illuminated using ultraviolet light, can include a mixture of blue-emitting QDs, red-emitting QDs, and green-emitting QDs; an ink composition for the light emitting layer of a red pixel can include solely red-emitting QDs; an ink composition for the light emitting layer of a green pixel can include solely green-emitting QDs; and an ink composition for the light emitting layer of a blue pixel can, optionally, include solely blue-emitting QDs.

The GSNP-containing ink compositions can include more than one type of GSNP, where the different types of GSNP differ by nominal particle size and/or shape, particle material, or both. Similarly, the PSNP-containing inks compositions can include more than one type of PSNP, where the different types of PSNP differ by nominal particle size and/or shape, particle material, or both.

The QDs optionally include a surface film of capping ligands. These capping ligands, which help to passivate the QDs and stabilize them against agglomeration, are frequently present as a result of the solution phase growth of the QDs. In addition, a second type of ligand, referred to herein as a crosslinkable ligand, may be included in the QD-containing ink compositions. The crosslinkable ligands attach to the QDs, typically via hydrogen bond formation, and also covalently crosslink to the polymer components in the ink composition as it cures. The crosslinkable ligands are monomers characterized in that they have one or more functional groups with polymerizable double bonds, such as acrylate or methacrylate groups, and a functional group which undergoes specific attachment to the surfaces of the QDs in the ink composition. The monomers may further include a spacer chain separating these functional groups. Such bi-functionality of the crosslinkable ligands keeps the QDs dispersed in the curable ink compositions, and prevents their re-aggregation during the curing process. For example, monomers containing carboxyl (—COOH), amine (—NR$_2$, where R is an H atom or an alkyl group), and thiol (—SH) groups have strong binding affinities for QDs composed of group II-VI elements. 2-Carboxyethyl acrylate (2CEA) is an example of a crosslinkable ligand for use with octadecylamine-capped core-shell CdSe/ZnS QDs.

In some embodiments of the ink compositions, the mono (meth)acrylate and/or di(meth)acrylate monomers are the primary component in the ink compositions on a weight basis. Various embodiments of these ink compositions have a combined mono(meth)acrylate and di(meth)acrylate monomer content in the range from about 65 wt. % to about 96 wt. %. (That is, the combined weight of all the mono (meth)acrylate and di(meth)acrylate monomers in the ink composition accounts for about 65 wt. % to about 96 wt. % of the ink composition; although the ink composition need not include both mono(meth)acrylate and di(meth)acrylate monomers.) This includes embodiments of the ink compositions having a combined mono(meth)acrylate and di(meth) acrylate monomer content in the range from about 65 wt. % to about 96 wt. % o in the range from about 75 wt. % to 95 wt. % and further includes embodiments of the ink compositions having a combined mono(meth)acrylate and di(meth) acrylate monomer content in the range from about 80 wt. % to 90 wt. %. Some embodiments of the ink composition include only a single mono(meth)acrylate monomer or a single di(meth)acrylate monomer, while others include a mixture of two or more mono(meth)acrylate monomers and/or di(meth)acrylate monomers. For example, various embodiments of the ink compositions include two mono (meth)acrylate monomers, two di(meth)acrylate monomers, or a mono(meth)acrylate monomer in combination with a di(meth)acrylate monomer. The weight ratios of the two monomers can vary significantly in order to tailor the viscosity, surface tension, and film-forming properties of the ink compositions. By way of illustration, some embodiments of the ink compositions that include two of the mono- or di(meth)acrylate monomers include a first mono(meth) acrylate or di(meth)acrylate monomer and a second mono (meth)acrylate or di(meth)acrylate monomer in a weight ratio in the range from 95:1 to 1:2, including in a weight ratio range from 12:5 to 1:2. This includes embodiments of the ink compositions in which the weight ratio of the first mono(meth)acrylate or di(meth)acrylate monomer to the second mono(meth)acrylate or di(meth)acrylate monomer is in the range from 12:5 to 4:5; further includes embodiments of the ink compositions in which the weight ratio of the first mono(meth)acrylate or di(meth)acrylate monomer to the second mono(meth)acrylate or di(meth)acrylate monomer is in the range from 5:4 to 1:2; and still further includes embodiments of the ink compositions in which the weight ratio of the first mono(meth)acrylate or di(meth)acrylate monomer to the second mono(meth)acrylate or di(meth) acrylate monomer is in the range from 5:1 to 5:4. For the purposes of the weight percentages and weight ratios recited in this paragraph, any crosslinking ligand present in the ink composition is not considered to be a mono(meth)acrylate or di(meth)acrylate monomer.

Ink compositions that include QDs will typically have a QD concentration in the range from about 0.1 wt. % to about 5 wt. %, including a QD concentration in the range from about 0.5 wt. % to about 2 wt. %—although concentrations outside of these ranges can be employed. The concentration of PSNPs can be very low because even a tiny amount of the PSNPs can make a large difference in the emission properties of a QD-containing layer. Therefore, in an ink composition that contains both QDs and PSNPs, the concentration of PSNPs will generally be substantially lower than the concentration of QDs. By way of illustration, various embodiments of the ink compositions have a PSNP concentration in the range from about 0.01 wt. % to about 5 wt. %, including a PSNP concentration in the range from about 0.01 wt. % to about 1 wt. % and from about 0.02 wt. % to about 0.1 wt. %. By way of illustration, various embodiments of the ink compositions have a GSNP concentration in the range from about 0.01 wt. % to 12 wt. %, including a GSNP concentration in the range from about 1 wt. % to about 10 wt. %.

If one or more crosslinkable ligands are included in a QD-containing ink composition, they typically account for about 1 wt. % to about 10 wt. % of the ink composition, including about 2 wt. % to about 8 wt. % of the ink composition.

Embodiments of the ink compositions for use in printing the QD-containing layer of a color filter may have a higher QD loading than that discussed above. For example, various embodiments of the QD-containing ink compositions for a color filter may have a QD concentration in the range from about 5 wt. % to about 50 wt. %, including a QD concentration in the range from about 10 wt. % to about 35 wt. %. As a result, the mono(meth)acrylate and di(meth)acrylate monomer content of these ink compositions will be lower than discussed above. For example, various embodiments of the QD-containing ink compositions for a color filter may have a mono(meth)acrylate and di(meth)acrylate monomer content in the range from about 50 wt. % to about 90 wt. %. This includes embodiments of the ink compositions having a mono(meth)acrylate and di(meth)acrylate monomer content in the range from about 60 wt. % to 80 wt. % and further includes embodiments of the ink compositions having a mono(meth)acrylate and di(meth)acrylate monomer content in the range from about 65 wt. % to 75 wt. %. An organic solvent may be added to these ink compositions to provide them with a viscosity and/or surface tension suitable for inkjet printing, as discussed above. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include xylenes, mesitylene, propylene glycol methyl ethers, methyl naphthalene, methyl benzoate, tetrahydronaphthalene, dimethyl formamide, terpineol, phenoxyethanol, and butyrophenone. If organic solvents are included in the ink compositions, the QD and monomer concentrations cited above are based on the solids content of the ink compositions.

For various embodiments of an organic thin layer ink composition, multifunctional (meth)acrylate crosslinking agents can account for between about 4 wt. % to about 10 wt. % of an ink composition. Generally, the photoinitiators will be included in amounts in the range from about 0.1 wt. % to about 10 wt. %, including amounts in the range from about 0.1 wt. % to about 8 wt. %. This includes embodiments in which the photoinitiators are present in amounts in the range from about 1 wt. % to about 6 wt. %, further includes embodiments in which the photoinitiators are present in amounts in the range from about 3 wt. % to about 6 wt. %, and still further includes embodiments in which the photoinitiators are present in amounts in the range from about 3.75 wt. % to about 4.25 wt. %.

The specific photoinitiators used for a given ink composition are desirably selected such that they are activated at wavelengths that are not damaging to materials used in the fabrication of the device, such as materials used in the fabrication of LCD display devices. The photoinitiators can be selected such that initial polymerization is induced at wavelengths in the UV region of the electromagnetic spectrum, the blue region of the visible spectrum, or both. For example, a QD-containing ink composition that contains a mixture of green-emitting QDs and red-emitting QDs can be used to print a QD-containing layer that can be illuminated with blue incident light. A portion of the blue light is then converted into red and green light to create white light. This ink composition can include a photoinitiator that triggers polymerization at a wavelength in the blue region of the electromagnetic spectrum. Although the blue light is somewhat attenuated by the QDs in the layer, it still penetrates through the film. Thus, a completely cured layer can be achieved using a light source that emits blue light. For example, an LED having a peak intensity around 395 nm could be used. The photoinitiator would ultimately decompose (bleach) during curing and, thus, the blue absorption by the photoinitiator would gradually decrease until it becomes colorless. Thus, the emission spectrum of the layer will change during the curing process, but the final white light emission spectrum can be controlled by taking the effect of the photoinitiator into account.

An acylphosphine oxide photoinitiator can be used, though it is to be understood that a wide variety of photoinitiators can be used. For example, but not limited by, photoinitiators from the α-hydroxyketone, phenylglyoxylate, andoc-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include Irgacure® TPO (also previously available under the tradename Lucirin® TPO) initiators for UV curing sold under the tradenames Irgacure® TPO, a type I hemolytic initiator which; with absorption @ 380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm² could be used to cure an ink composition comprising a TPO photoinitiator. Using the appropriate energy sources, high levels of curing can be achieved. For example, some embodiments of the cured films have a degree of curing of 90% or greater, as measured by Fourier Transform Infrared (FTIR) spectroscopy.

Given that the initiation of polymerization can be induced by light, ink compositions can be prepared to prevent exposure to light. With respect to preparation of organic thin layer ink compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm.

Figure 26:
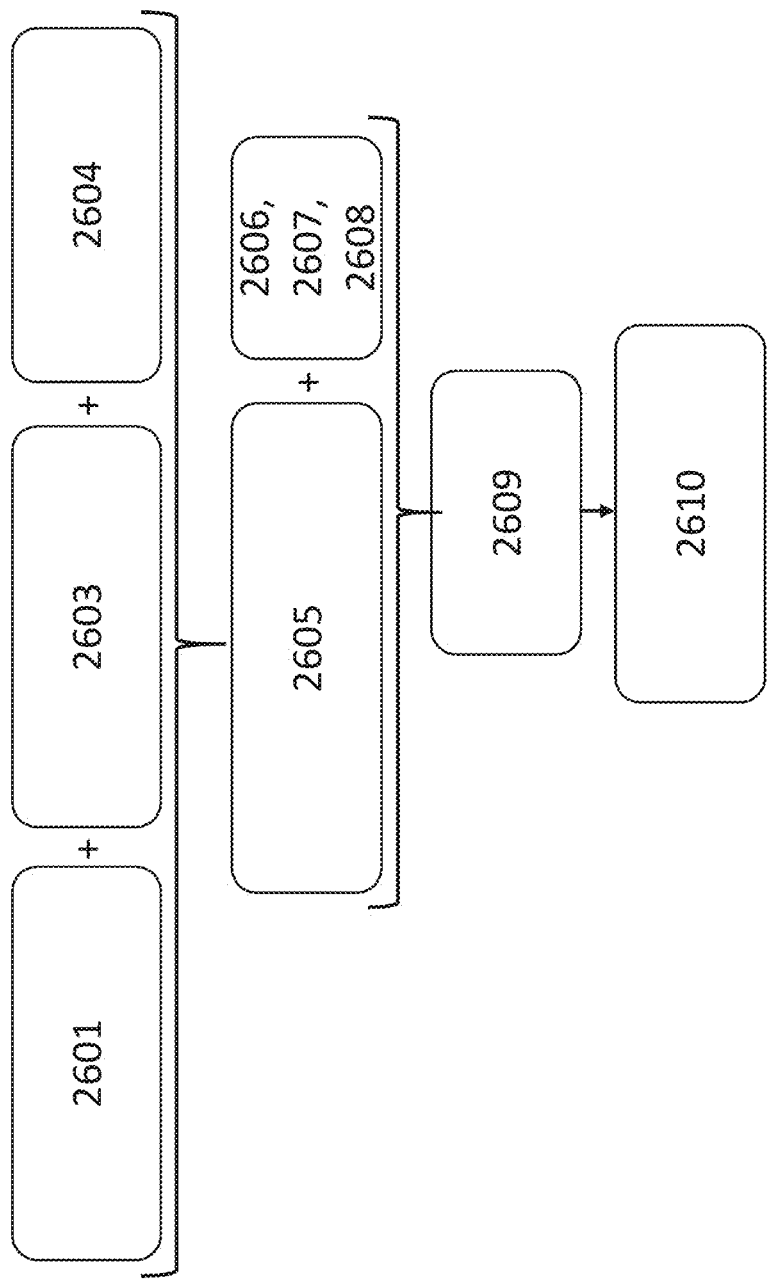
FIG. 26 shows a flowchart for a method of formulating a QD-containing ink composition.

A flowchart for a method of formulating a QD-containing ink composition is provided in FIG. 26. To formulate an ink composition, a mixture 2601 of the mono(meth)acrylate and/or di(meth)acrylate monomers and the multifunctional (meth)acrylate crosslinking agent are mixed together with a photoinitiator 2603 to form an initial curable monomeric blend 2605. If the ink composition will include crosslinkable ligands 2604, they can also be added to curable monomeric blend 2605. Then QDs 2606 and, optionally GSNPs 2607 and/or PSNPs 2608 are dispersed in curable monomeric blend 2605 to form a dispersion 2609. The QDs and other particles may be added in the form of an aqueous or non-aqueous, organic solvent-based dispersion. If so, water or organic solvent optionally can be removed from dispersion 2609 to form a second dispersion 2610. The ink composition is then ready for use and should be stored away from light. Once the ink compositions are prepared, they can be dehydrated by mixing in the presence of molecular sieve beads for a period of a day or more and then stored under a dry, inert atmosphere, such as a compressed dry air atmosphere.

The ink compositions can be printed using a printing system, such as that described in U.S. Pat. No. 8,714,719, which is incorporated herein in its entirety. The films can be cured in an inert nitrogen environment using UV radiation. The ink compositions are designed to be applied by inkjet printing and are, therefore, characterized by jettability, wherein a jettable ink composition displays constant, or substantially constant, drop velocities, drop volumes and drop trajectories over time when jetted continuously through the nozzle of a printhead. In addition, the ink compositions are desirably characterized by good latency properties, where latency refers to the time that nozzles can be left uncovered and idle before there is a significant reduction in performance, for instance a reduction in drop velocity or volume and/or a change in trajectory that will noticeably affect the image quality.

By way of illustration only, various embodiments of ink compositions comprising QDs for printing QD-containing layers for photonic devices are described immediately below and in the Examples that follow. One embodiment of an ink composition contains 75-95 wt. % of a polyethylene glycol dimethacrylate monomer, a polyethylene glycol diacrylate monomer, or a combination thereof, wherein the polyethylene glycol dimethacrylate monomer and the polyethylene glycol diacrylate monomer have number average molecular weights in the range from about 230 g/mole to about 430 g/mole; 1 wt. % to 10 wt. % multifunctional (meth)acrylate crosslinking agent; and 0.1 wt. % to 5 wt. % quantum dots.

Another embodiment of an ink composition contains 70 wt. % to 95 wt. % of a neopentyl glycol-containing diacrylate monomer, a neopentyl glycol-containing dimethacrylate monomer, or a combination thereof; 1 wt. % to 10 wt. % multifunctional (meth)acrylate crosslinking agent; and 0.1 wt. % to 5 wt. % quantum dots.

Various embodiments of the present ink compositions can be deposited on a substrate, such as glass, silicon, and/or silicon nitride using pattered area printing of layers that are continuous or discontinuous.

EXAMPLE INK COMPOSITIONS

Example 1

This example illustrates the formulation of various curable ink compositions, including QD-containing ink compositions, that can be used to inkjet print the various layers of a QD color filter or a CED.

Seven illustrative inkjet printable ink compositions were prepared. Each ink composition included a single mono- or diacrylate monomer as a primary polymeric component. The seven monomers were cyclic trimethylolpropane formal acrylate, propoxylated neopentyl glycol diacrylate, alkoxylated tetrahydrofurfuryl acrylate, 2-phenoxyethyl acrylate, 1,6-hexanediol diacrylate, 1,3-butylene glycol diacrylate, and 2(2-ethoxyethoxy)ethyl acrylate. The structures, room temperature (~22° C.) surface tensions, and room temperature viscosities for each monomer is presented in the table of FIG. 25. Each of the ink compositions contained 89 wt. % of the mono- or diacrylate monomer; 7 wt. % pentaerythritol tetraacrylate (PET) as a multifunctional acrylate crosslinker; and 4 wt. % of the photoinitiator 2,4,6-trimethylbenzoyl-diphenyl phosphine oxide (TPO). The ink compositions were formulated by mixing three components overnight and filtering the mixture through a 0.45 µm PTFE membrane filter. The ink compositions were then tested with Dimatix printer for their ink jetting properties, and film formation on UV ozone (UVO)-treated, low-temperature silicon nitride (SiN$_x$) substrates. All of the ink compositions had good jetting behavior, and were able to form thin films with thicknesses of 2 µm or higher.

Layers inkjet printed using the inks containing the monomers propoxylated neopentyl glycol diacrylate, alkoxylated tetrahydrofurfuryl acrylate, and 1,6-hexanediol diacrylate demonstrated the most controlled film formation and best edge definition. So, the ink composition containing propoxylated neopentyl glycol diacrylate and the ink composition containing 1,6-hexanediol diacrylate were chosen to illustrate the formulation of QD-containing ink compositions. 2-Carboxyethyl acrylate (2CEA) in an amount of 5 wt. % was added to each ink composition as a crosslinkable ligand in preparation for the subsequent addition of octadecylamine-capped core-shell CdSe/ZnS QDs. The structure of 2CEA is:

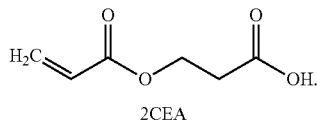

2CEA

Before being added to the initial ink compositions, the 2CEA crosslinkable ligand was dried over molecular sieves to remove residual moisture and filtered through 0.45 µm PTFE membrane filter. The two 2CEA-containing ink compositions were used as base ink compositions for the subsequent addition of the QDs. The formulations for the two base ink compositions are shown in the table of FIG. 27. Both of these ink compositions were re-tested for jetting performance, and film formation and were found to be inkjet printable. Of the two ink compositions, the ink composition containing the 1,6-hexanediol diacrylate was selected to demonstrate the incorporation of QDs in an ink composition for inkjet printing.

Prior to the addition of the QDs, the ink composition was purged with nitrogen for 30 min, and transferred into nitrogen glove box. All further preparation steps were carried out in the nitrogen glove box. To prepare a QD-containing ink composition, a 25 mg/ml toluene stock solution of octadecylamine-capped core-shell CdSe/ZnS QDs was dispersed in anhydrous toluene via 5 minutes of sonication, and filtered through a 0.45 µm PTFE membrane filter. The toluene QDs stock solution was added to the 1,6-hexanediol diacrylate-containing base ink composition in an amount sufficient to provide a final QD-containing ink composition having a QD concentration (after toluene removal—see below) of 1 wt. %. The mixture was stirred for 30 min to assure a homogeneous distribution of the QDs in the ink composition. This composition was sealed in a septum vial and removed from the glove box. Toluene was removed from the ink composition by a 30-minute nitrogen purge, followed by 30 minutes of vacuum drying to remove residual solvent. Alternatively, the QDs could have been added to the base ink composition directly as a dry material (without stock solution preparation) and sonicated to assure a homogeneous QD dispersion, provided that the selected QDs had good solubility in the polymeric components of the composition.

Two QD-containing ink compositions were prepared from the 1,6-hexanediol diacrylate-containing base ink composition. Red-emitting QDs were used in the first QD-containing ink composition and green-emitting QDs were used in the second QD-containing ink composition. The formulations for the two QD-containing ink compositions, along with their room temperature surface tensions and viscosities, are shown in the table of FIG. 28. Both of these ink compositions were tested for jetting and film formation behavior using a Dimatix printer. Both ink compositions were printed on a UVO treated SiNs$_x$ surface and were found to be inkjet printable, although the ink composition containing the red-emitting QD was found to have more stable jetting properties. The printed layers were cured for 1 minute under 395 nm excitation in a nitrogen environment. Notably, both of the ink compositions retained their photoluminescence in the red and green when illuminated by 405 nm light after being incorporated into the base ink compositions and after printing and curing.

Example 2

This example illustrates the use of a QD- and PSNP-containing ink composition for inkjet printing a light-emitting layer having an enhanced light output.

An initial ink composition was prepared by mixing 1,6-hexanediol diacrylate, PET, and TPO in quantities appropriate to provide an ink composition containing 89 wt. % 1,6-hexanediol diacrylate; 7 wt. % PET; and 4 wt. % TPO. The ink composition was formulated by mixing the three components overnight and filtering the mixture through 0.45 µm PTFE membrane filter. Prior to the addition of the QDs, the ink composition was purged with nitrogen for 30 min, and transferred into nitrogen glove box. All further preparation steps were carried out in the nitrogen glove box.

To prepare a QD-containing ink composition, a 25 mg/ml toluene stock solution of capped core-shell InP/ZnS QDs was dispersed in anhydrous toluene via 5 minutes of sonication, and filtered through a 0.45 µm PTFE membrane filter. The toluene QDs stock solution was added to the 1,6-hexanediol diacrylate-containing base ink composition in an amount sufficient to provide a final QD-containing ink composition having a QD concentration (after toluene removal—see below) of 1 wt. %. The mixture was stirred for 30 min to assure a homogeneous distribution of the QDs in the ink composition. This composition was sealed in a septum vial and removed from the glove box. Toluene was removed from the ink composition by a 30-minute nitrogen purge, followed by 30 minutes of vacuum drying to remove residual solvent. Two QD-containing ink compositions were prepared. Red-emitting QDs were used in the first QD-containing ink composition and green-emitting QDs were used in the second QD-containing ink composition.

To prepare a PSNP-containing ink composition, a dispersion of silver nanoparticles (AgNPs—the PSNPs) in water (Nanogap Inc., Richmond, Calif.) was added to the 1,6-hexanediol diacrylate-containing base ink composition in an amount sufficient to provide a final AgNP-containing ink composition having a AgNP concentration of 0.05 wt. %. The AgNPs had a nominal particle size in the range from about 50 nm to about 80 nm. Prior to being added to the base ink composition, the AgNP dispersion was sonicated for 2 minutes.

In order to form a printed layer containing the QDs and the AgNPs, the AgNP-containing ink composition and the QD-containing ink composition were inkjet printed sequentially on a glass substrate in air using a Dimatix printer with a drop volume of 10 pL. In this process, a first layer of the AgNP-containing ink composition was deposited on the glass substrate and a second layer of the QD-containing ink composition was deposited over the first layer. The first layer was not cured prior to the deposition of the second layer, such that the printed ink compositions were able to mix to provide a single blended layer containing both the QDs and the PSNPs. Then, the final blended layer was subjected to a cure for 1 minute under 395 nm excitation in a nitrogen environment.

During the inkjet printing of the PSNP-containing ink composition, the volume printed per unit surface area was increased from one edge of the printed layer to the other. During the inkjet printing of the QD-containing ink composition, the volume printed per unit surface area was constant throughout the printing process. In particular, the volume of the PSNP-containing ink composition delivered to the starting edge of the layer was sufficient to provide a printed layer thickness of 2 μm. This volume gradually increased until the volume of the PSNP-containing ink composition delivered to the final edge of the layer was sufficient to provide a printed layer thickness of 20 μm. The volume of the QD-containing ink composition delivered across the length of the layer was sufficient to provide a printed layer thickness of 6 μm. Notably, although the edge-to-edge thickness variation of the printed film normalized somewhat as the two printed layers blended into a single layer, the thickness variation was partially retained to some degree post-cure.

Figure 29A:
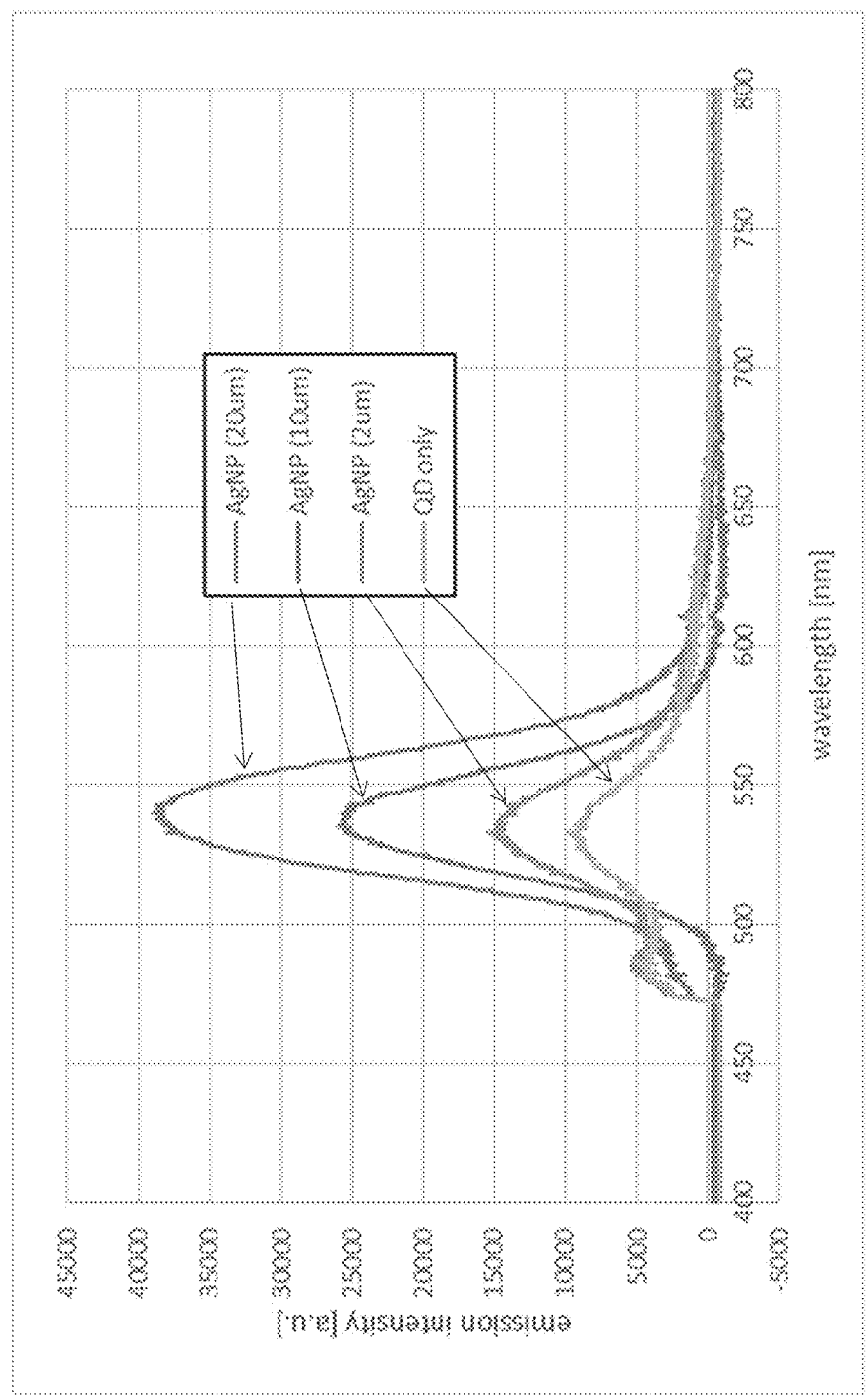
FIG. 29A shows the emission spectra for a layer containing silver nanoparticle plasmonic scatterers in combination with green-emitting QDs and for a layer containing only green-emitting QDs, without any silver nanoparticle plasmonic scatterers.
Figure 29B:
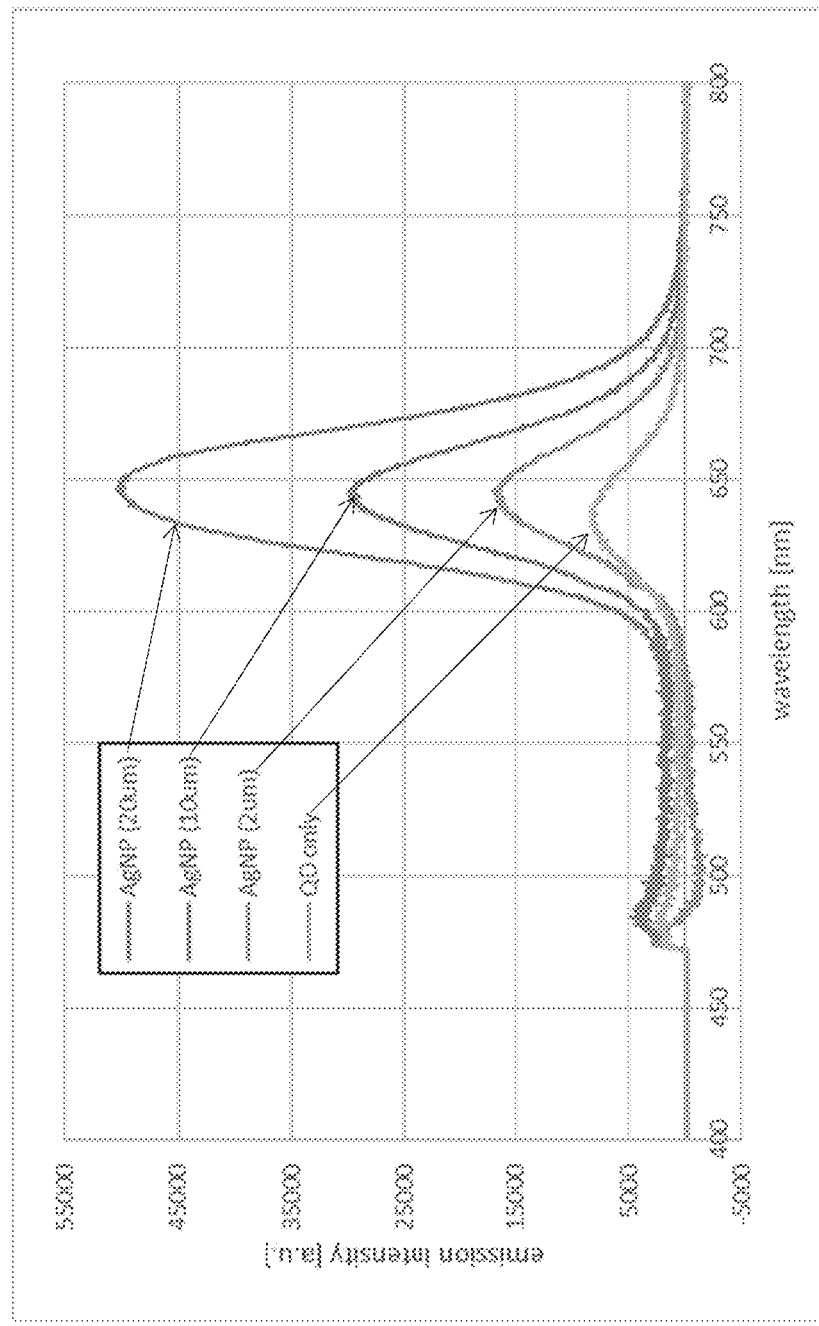
FIG. 29B shows the emission spectra for a layer containing silver nanoparticle plasmonic scatterers in combination with red-emitting QDs and a layer containing only the green-emitting QDs, without any silver nanoparticle plasmonic scatterers.

The photoluminescent properties of a cured layer containing the AgNPs plasmonic scatterers in combination with the green-emitting QDs; a cured layer containing only the green-emitting QDs, without any PSNPs; a cured layer containing the AgNPs plasmonic scatterers in combination with the red-emitting QDs; and a cured layer containing only the red-emitting QDs, without any PSNPs were measured. The measurement was performed using a fluorometer (Oceanoptics Flame-S-VIS-NIR) at an excitation wavelength of 405 nm. The intensity of the light was integrated over a 100 ms timeframe and the resulting detector count was used to compare the emission intensity. The emission spectra for the layer containing the AgNPs plasmonic scatterers in combination with the green-emitting QDs and the layer containing only the green-emitting QDs, without any PSNPs are shown in FIG. 29A. The emission spectra for the layer containing the AgNPs plasmonic scatterers in combination with the red-emitting QDs and the layer containing only the red-emitting QDs, without any PSNPs are shown in FIG. 29B. The emission spectra for the PSNP-containing layers were measured at different layer thicknesses. As shown in the graphs of FIGS. 29A and 29B, the addition PSNPs to the QD-containing layers substantially increased the photoluminescence intensity for both of the PSNP-containing layers—increasing the emission intensity of the green-emitting QD-containing layer by a factor of greater than 4 and increasing the emission intensity of the red-emitting QD-containing layer by a factor of greater than 6, relative to their respective layers containing only QDs.

The present teachings are intended to be illustrative, and not restrictive. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A photonic device comprising:
   a photonic device substrate;
   a first crosslinked polymer film over the photonic device substrate, the first crosslinked polymer film comprising:
      70 wt. % to 96 wt. % polymer chains comprising polymerized di(meth)acrylate monomers, or a combination of polymerized di(meth)acrylate monomers and mono(meth)acrylate monomers;
      4 wt. % to 10 wt. % polymerized multifunctional (meth)acrylate monomers crosslinking the polymer chains;
      0.1 wt. % to 5 wt. % quantum dots; and
      0.01 wt. % to 5 wt. % plasmonic scattering particles; and
   a second crosslinked polymer film disposed between the photonic device substrate and the first crosslinked polymer film, the second crosslinked polymer film comprising:
      70 wt. % to 96 wt. % polymer chains comprising polymerized di(meth)acrylate monomers, or a combination of polymerized di(meth)acrylate monomers and mono(meth)acrylate monomers;
      4 wt. % to 10 wt. % polymerized multifunctional (meth)acrylate monomers crosslinking the polymer chains; and
      0.01 wt. % to 5 wt. % geometric scattering particles.

2. The photonic device of claim 1, wherein the first crosslinked polymer film and the second crosslinked polymer film are in a sub-pixel cell of a color filter and the photonic device is a liquid crystal display device.

3. The photonic device of claim 2, wherein the color filter comprises:
   a plurality of sub-pixel cells defined in a pixel bank; and
   a plurality of light-emitting sub-pixels, including a plurality of red light-emitting sub-pixels, a plurality of green light-emitting sub-pixels, and a plurality of blue light-emitting sub-pixels; each light-emitting sub-pixel being disposed in one of the sub-pixel cells;
   wherein each of the red light-emitting sub-pixels comprises: a red light-emitting layer and a local light filter layer comprising a light absorber disposed on a light-emitting surface of the red light-emitting layer; and
   wherein each of the green light-emitting sub-pixels comprises: a green light-emitting layer and a local light filter layer comprising a light absorber disposed on a light-emitting surface of the green light-emitting layer.

4. The photonic device of claim 1, wherein the first crosslinked polymer film further comprises ligands bound to the quantum dots, wherein the ligands are crosslinked to the polymer chains.

5. The photonic device of claim 1, wherein the polymerized di(meth)acrylate monomers of the first crosslinked polymer film comprise polymerized 1,6-hexanediol di(meth)acrylate monomers.

6. The photonic device of claim 1, wherein the polymerized di(meth)acrylate monomers of the first crosslinked polymer film comprise polymerized propoxylated neopentyl glycol diacrylate monomers.

7. The photonic device of claim 1, wherein the polymerized di(meth)acrylate monomers of the first crosslinked polymer film comprise polymerized 1,12 dodecanediol di(meth)acrylate monomers.

8. The photonic device of claim 1, wherein the polymerized di(meth)acrylate monomers of the first crosslinked polymer film comprise polymerized polyethylene glycol di(meth)acrylate monomers.

9. The photonic device of claim 1, wherein the polymerized multifunctional (meth)acrylate monomers of the first crosslinked polymer film comprise polymerized tri(meth)acrylate monomers, polymerized tetra(meth)acrylate monomers, or a combination thereof.

10. The photonic device of claim 1, wherein the first crosslinked polymer film comprises 0.01 wt. % to 1 wt. % plasmonic scattering particles.

11. The photonic device of claim 1, wherein the plasmonic scattering particles comprise silver nanoparticles.

12. The photonic device of claim 1, wherein the plasmonic scattering particles are characterized in that, when incident light is incident upon the plasmonic scattering particles, local oscillating electric fields extending out from the plasmonic scattering particles are created, and further wherein the local oscillating electric fields of the plasmonic scattering particles couple to the quantum dots.

13. The photonic device of claim 1, wherein the photonic device substrate is a light guide.

* * * * *